(12) United States Patent
Eisert et al.

(10) Patent No.: US 9,444,022 B2
(45) Date of Patent: Sep. 13, 2016

(54) OPTOELECTRONIC SEMICONDUCTOR CHIP, OPTOELECTRONIC SEMICONDUCTOR COMPONENT, AND A METHOD FOR PRODUCING AN OPTOELECTRONIC SEMICONDUCTOR COMPONENT

(75) Inventors: Dominik Eisert, Regensburg (DE); Torsten Baade, Regensburg (DE); Michael Zitzlsperger, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 4 days.

(21) Appl. No.: 14/118,475

(22) PCT Filed: May 18, 2012

(86) PCT No.: PCT/EP2012/059278
§ 371 (c)(1),
(2), (4) Date: Jan. 15, 2014

(87) PCT Pub. No.: WO2012/156514
PCT Pub. Date: Nov. 22, 2012

(65) Prior Publication Data
US 2014/0117396 A1    May 1, 2014

(30) Foreign Application Priority Data

May 18, 2011  (DE) .......................... 10 2011 050 450

(51) Int. Cl.
*H01L 33/50* (2010.01)
*H01L 33/44* (2010.01)
(Continued)

(52) U.S. Cl.
CPC .............. *H01L 33/50* (2013.01); *H01L 33/44* (2013.01); *H01L 33/505* (2013.01); *H01L 33/52* (2013.01);
(Continued)

(58) Field of Classification Search
CPC ....... H01L 33/50; H01L 33/52; H01L 33/60; H01L 2224/48247; H01L 2224/48471
USPC .......................................................... 257/98
See application file for complete search history.

(56) References Cited

U.S. PATENT DOCUMENTS

| | | |
|---|---|---|
| 7,923,741 B1 | 4/2011 | Zhai et al. |
| 2002/0063520 A1 | 5/2002 | Yu et al. |
| 2003/0201451 A1 | 10/2003 | Suehiro et al. |
| 2005/0248271 A1* | 11/2005 | Ng .................... H01L 33/505 313/512 |

(Continued)

FOREIGN PATENT DOCUMENTS

| | | | |
|---|---|---|---|
| DE | 10 2004 052 456 A1 | 4/2006 | |
| DE | 10 2006 045 702 A1 | 4/2008 | |

(Continued)

*Primary Examiner* — Tran Tran
(74) *Attorney, Agent, or Firm* — DLA Piper LLP (US)

(57) ABSTRACT

An optoelectronic semiconductor chip includes a semiconductor body that emits primary light, and a luminescence conversion element that emits secondary light by wavelength conversion of at least part of the primary light, wherein the luminescence conversion element has a first lamina fixed to a first partial region of an outer surface of the semiconductor body, the outer surface emitting primary light, and leaves free a second partial region of the outer surface, the luminescence conversion element has a second lamina fixed to a surface of the first lamina facing away from the semiconductor body and spaced apart from the semiconductor body, the first lamina is at least partly transmissive to the primary radiation, a section of the second lamina covers at least the second partial region, and at least the section of the second lamina is designed to be absorbent and/or reflective and/or scattering for the primary radiation.

7 Claims, 14 Drawing Sheets

(51) Int. Cl.
 H01L 33/60 (2010.01)
 H01L 33/52 (2010.01)
 *H01L 33/48* (2010.01)
 *H01L 33/56* (2010.01)
 *H01L 33/62* (2010.01)

(52) U.S. Cl.
 CPC ............ H01L 33/60 (2013.01); *H01L 33/486* (2013.01); *H01L 33/56* (2013.01); *H01L 33/62* (2013.01); *H01L 2224/48247* (2013.01); *H01L 2224/48471* (2013.01); *H01L 2224/48479* (2013.01); *H01L 2924/181* (2013.01); *H01L 2933/0091* (2013.01)

(56) References Cited

U.S. PATENT DOCUMENTS

| | | |
|---|---|---|
| 2006/0291246 A1 | 12/2006 | Hattori et al. |
| 2010/0177527 A1 | 7/2010 | Tsutsumi et al. |

FOREIGN PATENT DOCUMENTS

| | | |
|---|---|---|
| DE | 10 2007 055 170 A1 | 6/2008 |
| DE | 10 2007 057 710 A1 | 4/2009 |
| DE | 10 2008 015 550 A1 | 10/2009 |
| DE | 10 2010 025 608 A1 | 1/2012 |
| DE | 10 2010 027 253 A1 | 1/2012 |
| DE | 10 2010 055 265 A1 | 6/2012 |
| DE | 10 2011 056 810 A1 | 6/2013 |
| EP | 1 385 216 A2 | 1/2004 |
| EP | 1 780 805 A1 | 5/2007 |
| EP | 2 315 280 A2 | 4/2011 |
| EP | 2 346 101 A1 | 7/2011 |
| WO | 2006/097876 A1 | 9/2006 |
| WO | 2008/002362 A1 | 1/2008 |
| WO | 2008/040283 A1 | 4/2008 |
| WO | 2009/115998 A2 | 9/2009 |
| WO | 2009/148717 A2 | 12/2009 |
| WO | 2010/010484 A1 | 1/2010 |
| WO | 2010/044240 A1 | 4/2010 |
| WO | 2010/045915 A1 | 4/2010 |
| WO | 2010/067291 A1 | 6/2010 |
| WO | 2010/069282 A2 | 6/2010 |
| WO | 2010/083929 A1 | 7/2010 |
| WO | 2010/134011 A2 | 11/2010 |
| WO | 2010/143114 A1 | 12/2010 |
| WO | 2011/009737 A1 | 1/2011 |

* cited by examiner

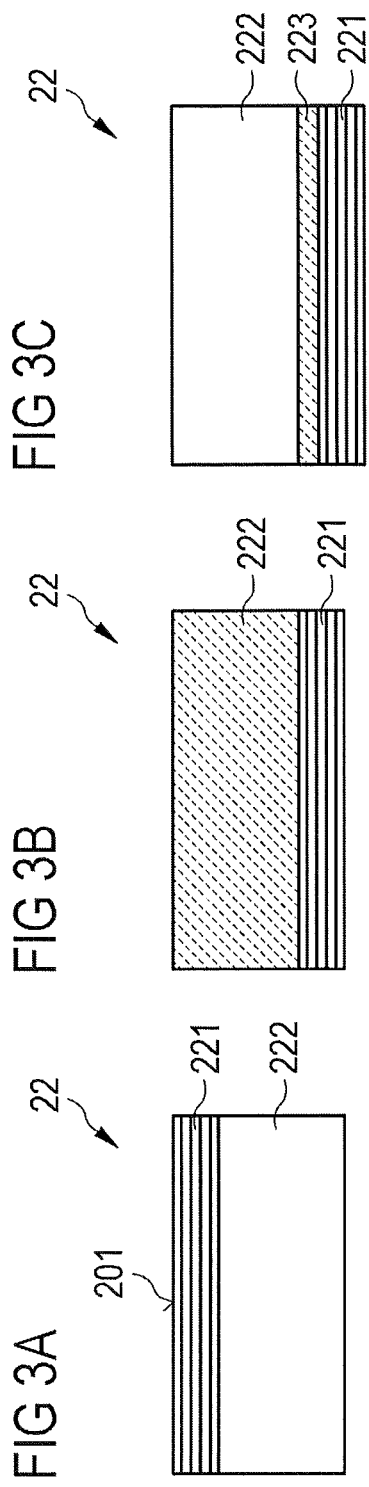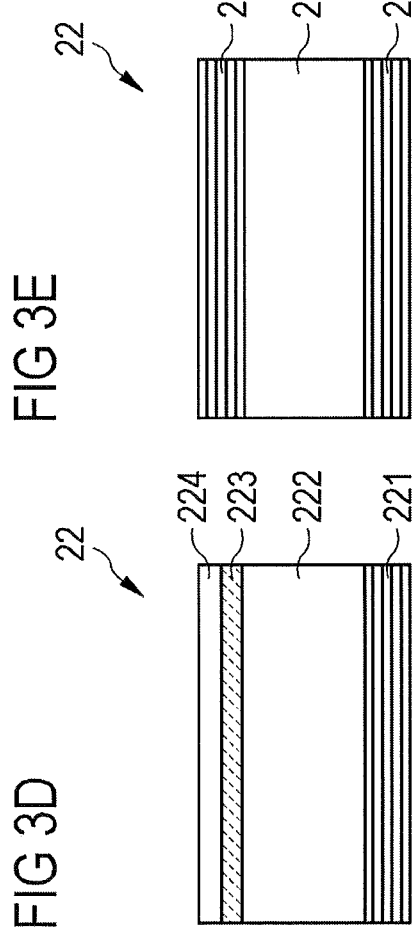

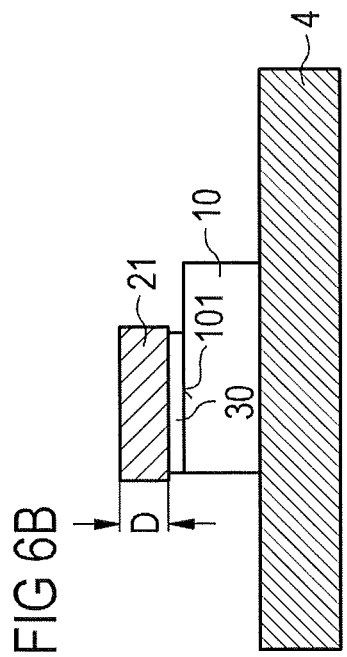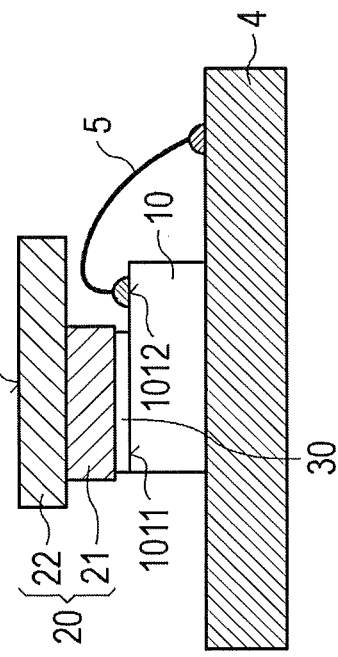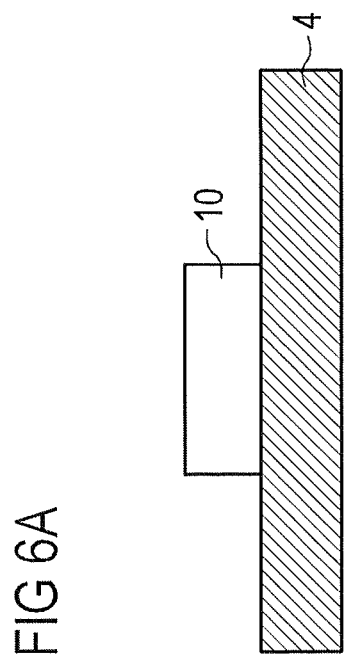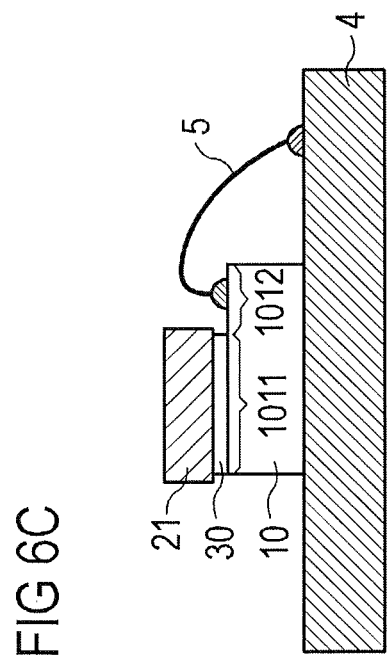

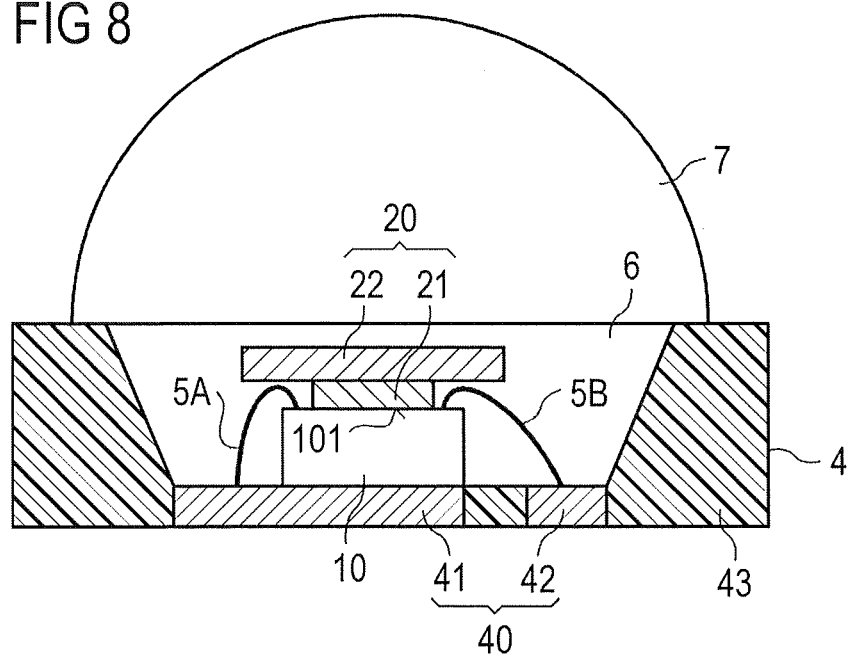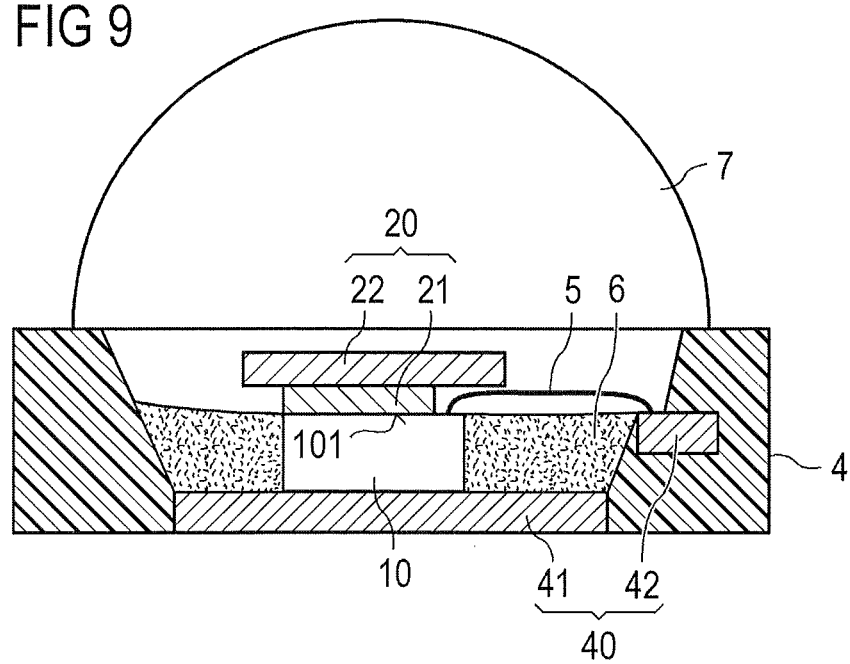

OPTOELECTRONIC SEMICONDUCTOR CHIP, OPTOELECTRONIC SEMICONDUCTOR COMPONENT, AND A METHOD FOR PRODUCING AN OPTOELECTRONIC SEMICONDUCTOR COMPONENT

TECHNICAL FIELD

This disclosure relates to an optoelectronic semiconductor chip, an optoelectronic semiconductor component, and a method of producing an optoelectronic semiconductor component.

BACKGROUND

Conventional optoelectronic semiconductor chips and optoelectronic components, which comprise a semiconductor body that emits primary light and a luminescence conversion element that emits secondary light, often emit an undesired primary light portion.

It could therefore be helpful to provide an optoelectronic semiconductor chip and an optoelectronic semiconductor component which emit particularly little undesired primary light.

SUMMARY

We provide an optoelectronic semiconductor chip including a semiconductor body that emits primary light, and a luminescence conversion element that emits secondary light by wavelength conversion of at least part of the primary light, wherein the luminescence conversion element has a first lamina fixed to a first partial region of an outer surface of the semiconductor body, the outer surface emitting primary light, and leaves free a second partial region of the outer surface, the luminescence conversion element has a second lamina fixed to a surface of the first lamina facing away from the semiconductor body and spaced apart from the semiconductor body, the first lamina is at least partly transmissive to the primary radiation, a section of the second lamina covers at least the second partial region, and at least the section of the second lamina is designed to be absorbent and/or reflective and/or scattering for the primary radiation.

We also provide a method of producing the optoelectronic component including a semiconductor chip, wherein an electrical connection location composed of a metallic material is applied to that partial region of the outer surface of the semiconductor body which is left free by the first lamina and an electrical connection conductor fixed to the electrical connection location, wherein the second lamina covers the electrical connection conductor at least in places, including providing a carrier element for the semiconductor body, fixing the semiconductor body on the carrier element, fixing the electrical connection conductor to the semiconductor body and to the carrier element, and at least in places covering the connection conductor with the second lamina after the connection conductor has been fixed.

We further provide an optoelectronic component including a reflector cavity, a light-emitting semiconductor body that emits primary light in the reflector cavity and a luminescence conversion element that emits secondary light by wavelength conversion of at least part of the primary light, wherein the reflector cavity has an opening, a first partial region of the opening is covered with a reflector layer, a second partial region of the opening is not covered with the reflector layer, and the luminescence conversion element in a plan view of the opening completely overlaps the second partial region.

BRIEF DESCRIPTION OF THE DRAWINGS

FIGS. 3A to 3E show schematic sectional illustrations through different variants of second laminae.

FIGS. 6A to 6D show different stages of a method of producing an optoelectronic component in accordance with the second example in schematic sectional illustrations.

FIG. 8 shows a schematic sectional illustration through an optoelectronic component in accordance with a fourth example.

FIG. 9 shows a schematic sectional illustration through an optoelectronic component in accordance with a fifth example.

DETAILED DESCRIPTION

Figure 1A:
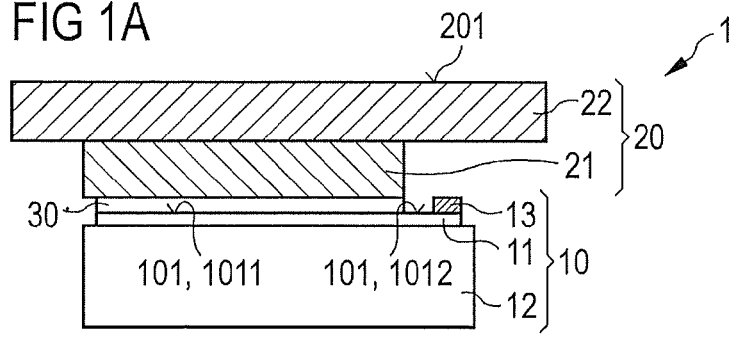
FIG. 1A shows an optoelectronic semiconductor chip in accordance with a first example in a schematic sectional illustration.

We provide an optoelectronic semiconductor chip, an optoelectronic semiconductor component and a method of producing the component. We also provide an optoelectronic semiconductor chip. The semiconductor chip is, for example, a light-emitting diode chip or a laser diode.

The semiconductor chip comprises a semiconductor body designed to emit primary light. The semiconductor body contains a pn junction, a double heterostructure or a quantum well structure to generate light. The semiconductor body, in particular the pn junction, the double heterostructure or the quantum well structure, is based, for example, on an inorganic semiconductor material, for instance a III/V compound semiconductor material such as AlInGaN or a II/VI compound semiconductor material such as ZnSe. By way of example, a semiconductor body based on InGaN which emits blue light as primary light is involved.

"Primary light" means the electromagnetic radiation generated by the semiconductor body. The primary light has in particular an intensity maximum in the infrared, visible or ultraviolet spectral range. It may have an intensity maximum in the blue spectral range. The wavelength of the intensity maximum lies, for example, between 400 nm and 470 nm.

The optoelectronic component comprises the semiconductor chip and a carrier element. The semiconductor chip is fixed on the carrier element.

In at least one configuration, the carrier element is a circuit board, for example, a printed circuit board. The semiconductor chip is fixed on the circuit board, for example, by so-called "chip-on-board" (COB) technology, which is known.

In another configuration, the carrier element is designed as a main housing. By way of example, it comprises a leadframe encapsulated with a housing main body by injection molding. In one configuration, the housing main body has a dark, in particular black, color. In one configuration, the main housing has a recess, in which the semiconductor chip is mounted.

In the case of a carrier element designed as a main housing, the component is provided in particular to populate a circuit board. By way of example, the component is suitable for surface mounting (SMT, surface mount technology) or for through hole mounting, also known as "through hole technology," on the circuit board.

In at least one configuration, the optoelectronic semiconductor chip and/or the optoelectronic component comprise a luminescence conversion element designed to emit secondary light by wavelength conversion of at least part of the primary light.

"Secondary light" means the wavelength-converted light generated by the luminescence conversion element by absorption of primary light. The primary light originates in particular from the emission of the semiconductor chip. In one configuration, the secondary light has at least one intensity maximum which is shifted to a longer wavelength compared with the intensity maximum of the primary light. By way of example, the intensity maximum lies in the green (520-565 nm), yellow (565-575 nm), orange (575-595 nm) or red (595-800 nm) spectral range.

In at least one configuration, the luminescence conversion element has a first lamina. In another configuration, the luminescence conversion element additionally has a second lamina.

A "lamina" means in particular a substantially prism-shaped, in particular a substantially cuboid-shaped, or substantially disk-shaped element. In this case, "substantially" means, for example, that corners and/or edges can be rounded, cutouts such as a corner absent in plan view are possible and/or side surfaces of the lamina do not have to be completely perpendicular to the base surface.

In one configuration, the lamina has a substantially constant thickness. That means in particular that the difference between the distances of two arbitrary segments of a top surface of the lamina, situated opposite the base surface of the lamina, from the base surface is less than or equal to 10%, preferably less than or equal to 5%, of the distance of the entire top surface from the base surface.

The lamina can be produced separately, in particular, and is prefabricated in one development. By way of example, it is suitable as being processed by a so-called "pick-and-place" method during the production of the semiconductor chip or semiconductor component. The lamina is preferably mechanically self-supporting, that is to say in particular that it does not bend or does not bend significantly on a length scale of an edge length of the semiconductor chip.

In at least one configuration, the thickness of the first lamina is 50 µm or greater, preferably 100 µm or greater, in particular 120 µm or greater, for example, 150 µm or greater. In one configuration, the thickness is 250 µm or less, preferably 200 µm or less. By way of example, the first lamina has a thickness of 100 µm to 200 µm, in particular 120 µm to 150 µm. The same thicknesses are also suitable for the second lamina.

In accordance with at least one configuration, the first lamina is designed to be at least partly transmissive to the primary radiation. By way of example, the first lamina is transparent. Alternatively, it can also be translucent. By way of example, it contains light-scattering particles in a transparent matrix material.

The first lamina may be designed to transmit incident primary light without wavelength conversion. In another configuration, the first lamina contains a phosphor. By way of example, it contains particles of an inorganic phosphor in an in particular transparent matrix material. The matrix material can be, for example, an epoxy resin or a silicone resin. Alternatively, the lamina can comprise or consist of a ceramic material containing the phosphor or a glass matrix containing the phosphor.

Alternatively, the phosphor can be applied to a transparent or translucent carrier, for example, to a glass carrier or ceramic carrier. By way of example, the phosphor is printed onto the carrier or deposited electrophoretically on the carrier. In this way, a very thin and highly concentrated phosphor layer (for example, having a phosphor concentration of 50% by volume or more, in particular of up to 60% by volume) can be obtained, with the result that a particularly good heat dissipation from the phosphor into the carrier can be obtained. The risk of overheating, in particular as a result of stokes heat, in the phosphor layer is thus particularly low. The carrier can be, for example, the second lamina or a constituent of the second lamina.

Appropriate phosphors include, for example, phosphors having a garnet structure such as $(Y,Gd)_3(Al,Ga)_5O_{12}:Ce$ (for example for yellow secondary light) and $Lu_3Al_5O_{12}:Ce$ (for example for green secondary light). Nitride phosphors such as $(Ba,Sr,Ca)_2Si_5N_8:Eu$, oxynitride phosphors (Ba,Sr, Ca)Si$_2$O$_2$N$_2$:Eu, orthosilicate phosphors such as (Ba,Sr,Ca)$_2$SiO$_4$:Eu, chlorosilicate phosphors such as Ca$_8$Mg(SiO$_4$)$_4$Cl$_2$:Eu and sulfide phosphors are also appropriate. Phosphors having a crystal structure which is a derivative of one of these crystal systems or similar to one of these crystal systems are also possible. By way of example, a mixture of an oxynitride phosphor that emits yellow secondary light with a nitride phosphor that emits red secondary light can be used. In the case of such a mixture, the color locus of the secondary light can be set particularly well.

The phosphor particles have, for example, a median diameter (also called d$_{50}$) of 5 μm or more, preferably of 10 μm or more, in particular of 15 μm or more. The medium diameter has a value or 50 μm or less, for example. With phosphor particles having such diameters, the ratio of absorption to scattering during the interaction of the particles with the primary light is particularly high.

The first lamina may be fixed to a first partial region of an outer surface of the semiconductor body, the outer surface emitting primary light, and leaves free a second partial region of the outer surface. The second lamina is, in particular, fixed to a surface of the first lamina facing away from the semiconductor body and spaced apart from the semiconductor body.

The first lamina may be fixed to the first partial region by a transparent or translucent adhesive layer. Alternatively, it can be produced directly on the semiconductor body. The thickness of the adhesive layer is in particular less than half, particularly preferably less than one quarter, particularly preferably less than ten percent of the thickness of the first lamina. By way of example, it has a thickness of 10 μm or less. The thickness of the adhesive layer may also have a value of 0.5 μm or more.

The second lamina can likewise be fixed to the first lamina by such an adhesive layer. Unevennesses of the adhesively bonded surfaces of the semiconductor body, of the first lamina and/or of the second lamina can advantageously be compensated for by the adhesive layer(s).

Alternatively, the first lamina can directly adjoin the second lamina. By way of example, it is produced directly on the second lamina. By way of example, it is applied to the second lamina by a casting, screen printing, electrophoresis, spray coating or spin coating method.

A section of the second lamina may cover at least the second partial region. The second lamina or at least the section of the second lamina is in particular absorbent and/or reflective and/or scattering for the primary radiation.

This advantageously reduces the risk of primary light emitted by the second partial region being coupled out from the semiconductor chip in an undesired manner. For example in the case of a first lamina which leaves free part of the outer surface of the semiconductor body that emits primary light, for example, in the case of a first lamina that is too small or is applied in a decentered manner, the emission properties can be improved by the second lamina, with the result that in particular the rejects during the production of the semiconductor chips are advantageously low. Moreover, it is possible, for example, to reduce the risk of undesired coupling-out of primary light that is coupled out from the adhesive layer in an undesired manner alongside the first lamina.

The second lamina can have the same dimensions as the semiconductor body in plan view. An edge region of the second lamina may laterally project beyond the semiconductor body and the edge region may be absorbent and/or reflective and/or scattering for the primary radiation. This advantageously reduces the risk of primary light that emerges from the side flanks of the semiconductor body, the adhesive layer and/or the first lamina being emitted from the semiconductor chip in an undesired manner.

The second lamina may contain diffuser particles contained in a matrix material, in particular a glass or a plastic such as epoxy resin or silicone resin. In this way, the second lamina, the section and/or the edge region are/is designed to be scattering for the primary light. A particularly good homogeneity in the appearance of the semiconductor chip in plan view can thus advantageously be obtained. A good intermixing of primary light and secondary light can likewise be obtained.

The second lamina may contain a phosphor. This can be the same phosphor or the same phosphor mixture as in the case of the first lamina. As in the case of the first lamina, the phosphor(s) can be embedded in a glass matrix, a plastic matrix, for example, an epoxy resin matrix or silicone resin matrix, or be contained in a ceramic material. With the phosphor, the second lamina, the section and/or the edge region are/is absorbent for the primary light. In addition, the second lamina or the section emits secondary light by the phosphor or phosphor mixture. The second lamina may contain at least one phosphor and the first lamina may be transparent or translucent.

Alternatively, the first and second laminae can contain the same phosphor or the same phosphor mixture or different phosphors. In this case, the intensity maximum of the phosphor contained in the first lamina preferably lies at a longer wavelength than the intensity maximum of the phosphor contained in the second lamina, as a result of which a particularly high total efficiency of the wavelength conversion can be obtained. However, the opposite arrangement is also possible. With two phosphor-containing laminae, the color locus of the light coupled out from the semiconductor chip can be set particularly well.

The second lamina may contain a wavelength-selective filter that transmits secondary light and absorbs and/or reflects primary light. A particularly efficient semiconductor chip can be obtained in this way.

A selectively absorbent material, in particular in the form of particles, may be admixed with a matrix material to form the wavelength-selective filter. The absorbent material can be, for example, very highly doped YAG:Ce having an absorption band at approximately 460 nm, ZnSe, MoS$_2$ and/or 3C—SiC. 3C—SiC is, in particular, silicon carbide having a cubic crystal structure and a band gap in the visible spectral range. The absorbent material can be contained in the form of particles in the second lamina which have, for example, median diameters of 5 μm or more, preferably of 10 μm or more, in particular of 15 μm or more. Advantageously, the scattering is thus particularly low.

So-called "ionic glasses," which are commercially available, for example, from Schott with the serial designation "BG," are also appropriate as wavelength-selective filters. By way of example, an ionic glass contains at least the elements Zn, K, Si and O.

The wavelength-selective filter may comprise an organic or inorganic dye, for example, a green, yellow, orange or red dye. With the dye, the second lamina, the section and/or the edge region are/is absorbent for the primary light.

The wavelength-selective filter alternatively or additionally may comprise a layer stack in which layers composed of a material having a high refractive index and layers composed of a material having a low refractive index alternately succeed one another. The layer stack is deposited, for example, on a carrier, for example, composed of plastic, glass, sapphire or 4H—SiC. 4H—SiC is a modification of silicon carbide which has a band gap outside the visible spectral range. With the use of a plastic carrier, the layer stack is preferably arranged between the semiconductor body and the carrier. The risk of damage to the plastic owing to the primary radiation is reduced in this way.

With the layer stack, the second lamina, the section and/or the edge region are/is reflective for the primary light. With a wavelength-selectively reflecting layer stack, a particularly efficient luminescence conversion element can be obtained since the primary light is reflected back from the layer stack into a phosphor-containing region of the luminescence conversion element, where it is available again for the wavelength conversion.

By way of example, the layer stack contains 10 to 20 layer pairs having an $SiO_2$ layer (e.g., having a refractive index n=1.4) and an $Si_3N_4$ layer (e.g., having a refractive index n=1.8). Instead of the $Si_3N_4$ layers, a layer composed of a material having a refractive index n≥1.9, preferably n≥1.95, in particular n≥2, can be used, for example, a layer composed of a titanium oxide such as titanium dioxide, of a tantalum oxide such as $Ta_2O_5$, for example, or a hafnium oxide such as $HfO_2$. A high reflectance in the blue spectral range and a high transmittance in the yellow and/or orange spectral range can be obtained in this way.

A plurality of sections may have layer pairs of different thicknesses. The sections are, in particular, stacked one above another. In this way, it is possible to obtain the desired wavelength selectivity for a particularly large range of angles of incidence of the primary and/or secondary light. By way of example, the layer pairs can have a thickness of 50 nm in the first section and a thickness of 55 nm in the second section. In one development, a first, a second and a third section succeed one another, wherein the layer pairs have a thickness of 50 nm in the first section, a thickness of 52 nm in the second section, and a thickness of 55 nm in the third section.

The second lamina may comprise a reflector layer, for example, a specularly reflective layer which covers the second partial region. The reflector layer is reflective in particular for primary radiation and secondary radiation. By way of example, it contains at least one metal such as Au, Ag and/or Al or consists thereof. The reflector layer expediently leaves at least part of the first partial region uncovered, that is to say, in a plan view of the second lamina, the reflector layer does not overlap, or only partly overlaps, the first lamina. In a plan view of the second lamina, the reflector layer may cover a circumferential edge region of the semiconductor body. If an edge region of the second lamina laterally projects beyond the semiconductor body, the reflector layer is preferably applied on the edge region. By way of example, the reflector layer is of ring-shaped design and leaves free only a central region of the second lamina, the central region completely overlapping the first lamina in plan view.

The reflector layer can be produced on a transparent or translucent carrier, for instance a glass or plastic carrier. Production can comprise a metallization step such as vapor deposition, and a patterning process, for instance by a shadow mask during vapor deposition, by photolithography or by laser patterning. By way of example, the reflector layer can contain gold or consist thereof. Gold advantageously absorbs blue primary light and reflects yellow secondary light.

The semiconductor chip may emit light which brings about a red, orange, yellow or green color impression. A semiconductor chip of this type is suitable, for example, as red and/or green light source for projection devices. In this case, a particularly high color brilliance and a satisfactory light intensity for projection applications can advantageously be obtained with the semiconductor chip. Alternatively, the semiconductor chip can be used as a light source for a motor vehicle luminaire, for example, as an orange light source for a flashing luminaire or warning luminaire or as a red light source for a rear or brake luminaire.

The first and/or the second lamina are/is absorbent and/or reflective for the primary radiation such that the luminescence conversion element, at its surface facing away from the semiconductor body and emits secondary light, emits at most three percent, preferably at most two percent, particularly preferably at most one percent, of the radiation power of a primary light coupled in through its surface facing the semiconductor body. In this way, the semiconductor chip is of fully converting design. In the case of a fully converting semiconductor chip, the color saturation, in particular the ratio of the radiation power of secondary to primary radiation, is, for example, greater than or equal to 95%, for example, greater than or equal to 96%, in particular greater than or equal to 98%.

For example, in the case of a fully converting semiconductor chip, the primary light may have an intensity maximum at a wavelength of 440 nm or less, for example, at a wavelength of 440 nm to 400 nm. A high color saturation with a particularly low phosphor concentration in the first and/or second lamina can be obtained in this way.

At least one electrical connection location composed of a metallic material, in particular a bonding pad, may be applied to that partial region of the outer surface of the semiconductor body which is left free by the first lamina. The optoelectronic component may have an electrical connection conductor fixed to the electrical connection location. The electrical connection conductor is, for example, a bonding wire or a conductor ribbon. The connection conductor has a thickness of 50 μm or less, for example. By way of example, a bonding wire having a cross section of 30 μm to 40 μm is used.

A conductor ribbon has, for example, a rectangular cross section the width of which is in particular greater than its height, for example, at least 1.5 times or at least 2 times the magnitude of its height. In this case, the width is the extent in the plane of the surface of the electrical connection location on which the conductor ribbon is fixed, and the height of the rectangular cross section is the extent perpendicular to the surface. By way of example, the height has a value of at most 30 μm. To put it another way, the conductor ribbon is a strip-shaped metal foil.

Preferably, the second lamina covers the electrical connection conductor at least in places. The connection conductor fixed to the connection location projects beyond the semiconductor body at least in the region covered by the second lamina expediently by a height smaller than the thickness of the first lamina. By way of example, the connection conductor in this region projects beyond the semiconductor body by 100 μm or less, in one configuration by 50 μm or less, for example, by 45 μm or less. In this way, the second lamina is advantageously spaced apart from the bonding wire or the conductor ribbon.

Fixing a conductor ribbon to the electrical connection location is effected, in particular in contrast to a bonding wire, preferably without a so-called "bond ball." In this way, the conductor ribbon projects beyond the outer surface of the semiconductor body to a particularly small extent, with the result that the thickness of the first lamina can be chosen to be particularly small.

The semiconductor body may be laterally surrounded with a reflective material, which leaves free at least the first partial region of the outer surface provided for emitting primary light. By way of example, the material is deposited on the circuit board or filled into the recess of the main housing. By way of example, the reflective material contains reflective particles, for example, $TiO_2$ particles in a matrix material such as a silicone resin or epoxy resin.

Embedding the semiconductor body into the reflective material can, for example, advantageously reduce the risk of primary light being emitted from the side flanks of the semiconductor body without impinging on the first and/or second lamina. Moreover, the risk of primary light impinging on the housing base, which is poorly reflected in places, for example, is reduced.

The semiconductor body and the first lamina may be surrounded with the reflective material and the reflective material may cover the second partial region at least in places. Preferably, the first lamina in this case either contains a ceramic material with phosphor or it is transparent or translucent without wavelength conversion properties. In particular, the adhesive layer with which the first lamina can be fixed on the semiconductor body is also laterally surrounded by the reflective material. In this way, the risk of the emission of primary light from locations of the semiconductor body other than the first partial region, on which the first lamina is fixed, is reduced further.

The first and/or the second lamina may contain a matrix material, for example, an epoxy resin into which filling particles are embedded, which are provided to vary the coefficient of thermal expansion. By way of example, the filling particles are glass beads. In particular, the coefficient of thermal expansion of the lamina is adapted, by the filling particles, to the coefficient of thermal expansion of an encapsulation compound of the component that envelopes the semiconductor chip. As an alternative to the use of a filler, for the purpose of adapting the coefficients of thermal expansion, a material similar to that for the encapsulation compound can also be used for the matrix material.

The optoelectronic component may comprise a reflector cavity and a reflector layer. The reflector cavity has an opening with a first partial region covered with the reflector layer, and a second partial region not covered by the reflector layer. The luminescence conversion element may completely overlap the second partial region in a plan view of the opening.

By way of example, the reflector cavity is formed by the recess of the main housing. Preferably, at least the circumferential side wall of the recess is reflectively coated, in particular by a silver and/or aluminum layer and/or by a, for example, highly reflective white color layer, for the purpose of forming the reflector cavity.

The reflector layer is applied, for example, to a carrier with which the opening is covered, in particular completely. By way of example, the carrier is placed as a cover onto the main housing.

In a plan view of the opening, the second partial region may completely overlap the semiconductor body. By way of example, the semiconductor body has a central region and an edge region extending circumferentially completely around the central region, and the reflector layer covers the opening including the edge region of the semiconductor body apart from the central region.

Such a configuration is advantageous, for example, for semiconductor chips in which the semiconductor body is provided with a converter lamina. A converter lamina is constructed, for example, like the above-described first lamina if the latter is provided with a phosphor. The reflector layer is used to reduce the risk of primary light from the semiconductor body which is emitted, for example, from the side flanks thereof, emerging from the reflector cavity without passing through the converter lamina.

Alternatively, the second partial region is arranged laterally with respect to the semiconductor body, in particular in the manner extending circumferentially around the semiconductor body, in an edge region of the opening. By way of example, the reflector layer covers a central region of the opening, which central region completely overlaps the semiconductor body, while an edge region of the opening, in particular an edge region of the opening which extends circumferentially completely around the central region of the opening, is not covered by the reflector layer and couples out light from the component.

Such a configuration is advantageous, for example, for components comprising a luminescence conversion potting material which partly or completely fills the reflector cavity. A luminescence conversion potting material contains, for example, particles of an in particular inorganic phosphor in a plastic matrix, for instance an epoxy or silicone resin. The abovementioned materials are particularly well suited as phosphor.

With the reflector layer, by way of example, a fully converting component having a particularly small structural height can be obtained. The height of the luminescence conversion potting material above the semiconductor body need not be chosen to be so large that, for example, primary light emitted perpendicularly from that outer surface of the semiconductor body facing away from the carrier element is completely absorbed upon passing for the first time through the luminescence conversion potting material from the semiconductor body as far as the opening. Rather, the non-absorbed portion of the primary light is reflected back into the luminescence conversion potting at the reflector layer.

Furthermore, a method of producing the optoelectronic component as described above is specified. The method involves providing the carrier element for the semiconductor body. Afterward, the semiconductor body is fixed on the carrier element. After the semiconductor body has been fixed, the electrical connection conductor is fixed to the semiconductor body and to the carrier element. After the connection conductor has been fixed, the connection conductor is covered with the second lamina at least in places.

The first lamina may be fixed before the fixing of the connection conductor to the semiconductor body, and the second lamina may be fixed to the first lamina after the connection conductor has been fixed. Alternatively, first, the luminescence conversion element with the first and second laminae is produced and the luminescence conversion element is fixed to the semiconductor body after the connection conductor has been fixed.

To produce the luminescence conversion element, in both configurations, by way of example, the first lamina can be adhesively bonded to the second lamina by an adhesive layer. If the luminescence conversion element with the first and second laminae is first produced and the composite comprising first and second laminae is subsequently fixed to the semiconductor body, alternatively the first lamina can be deposited on the second lamina or the second lamina can be deposited on the first lamina, for example, by a casting, screen printing, electrophoresis, spray coating or spin coating method.

A panel having a multiplicity of luminescence conversion element regions may be produced and subsequently singulated to form the luminescence conversion elements. By way of example, a glass plate provided with a layer sequence composed of layer pairs having alternately high and low refractive indices is coated electrophoretically with phosphor and subsequently singulated to form luminescence conversion elements having a second lamina, which has a glass carrier and a wavelength-selectively reflecting layer stack on the glass carrier, and a first lamina, which contains a phosphor.

An optoelectronic semiconductor chip may be specified comprising a semiconductor body that emits primary light, and a luminescence conversion element that emits secondary light by wavelength conversion of at least part of the primary light. The luminescence conversion element has a first lamina fixed to a first partial region of an outer surface of the semiconductor body, the outer surface emitting primary light, and leaves free a second partial region of the outer surface. Moreover, the luminescence conversion element has a second lamina, fixed to a surface of the first lamina facing away from the semiconductor body and is spaced apart from the semiconductor body. The first lamina is at least partly transmissive to the primary radiation. A section of the second lamina covers at least the second partial region. At least the section of the second lamina is absorbent and/or reflective and/or scattering for the primary radiation.

The semiconductor chip advantageously emits particularly little primary light which does not impinge on the first and/or second lamina. By way of example, the risk of color inhomogeneities at the edges of the semiconductor body is advantageously reduced compared with a semiconductor chip without the second lamina.

An optoelectronic component may be specified comprising a reflector cavity, a light-emitting semiconductor body which emits primary light, in the reflector cavity and a luminescence conversion element which emits secondary light by wavelength conversion of at least part of the primary light. The reflector cavity has an opening, a first partial region of the opening is covered with a reflector layer. A second partial region of the opening is not covered by the reflector layer. The luminescence conversion element completely overlaps the second partial region in a plan view of the opening.

An optically long path of the primary radiation through the luminescence conversion element with at the same time a small structural height of the component can be obtained in this way.

Further advantages of the optoelectronic semiconductor chip, of the optoelectronic component and of the methods will become apparent from the following examples illustrated in association with the figures.

In the figures and examples of the semiconductor chip of the component and of the method in accordance with the different examples, identical or similar constituents or identically or similarly acting constituents are provided with the same reference signs. The figures and the size relationships of the elements illustrated in the figures should not be regarded as to scale, unless a scale is explicitly indicated. Rather, individual elements may be illustrated with exaggerated size or thickness to enable better illustration and/or to afford a better understanding.

FIG. 1A shows an optoelectronic semiconductor chip in accordance with a first example in a schematic sectional illustration.

The semiconductor chip 1 contains an optoelectronic semiconductor body 10. The semiconductor body 10 has a semiconductor layer sequence 11, a substrate 12 and an electrical connection location 13.

The semiconductor layer sequence 11 contains, to generate light, that is to say to generate primary light, a pn junction, a double heterostructure or a quantum well structure as active layer. The semiconductor layer sequence 11, in particular the active layer, is based on a nitride compound semiconductor material such as AlInGaN, which comprises in particular GaN, InGaN and AlGaN. It is deposited epitaxially, for example, on the substrate 12. Alternatively, the substrate 12 can also be a carrier substrate which is different than the growth substrate of the semiconductor layer sequence 11 and to which the semiconductor layer sequence is applied, for example, after the epitaxial production thereof. A substrateless semiconductor body 10 without growth substrate or carrier substrate 12 is likewise conceivable.

The semiconductor body 10 emits primary light emitted by the semiconductor layer sequence during operation from an outer surface 101 situated opposite the substrate 12. The outer surface is, for example, parallel to the main extension planes of the layers of the semiconductor layer sequence 11.

Figure 1B:
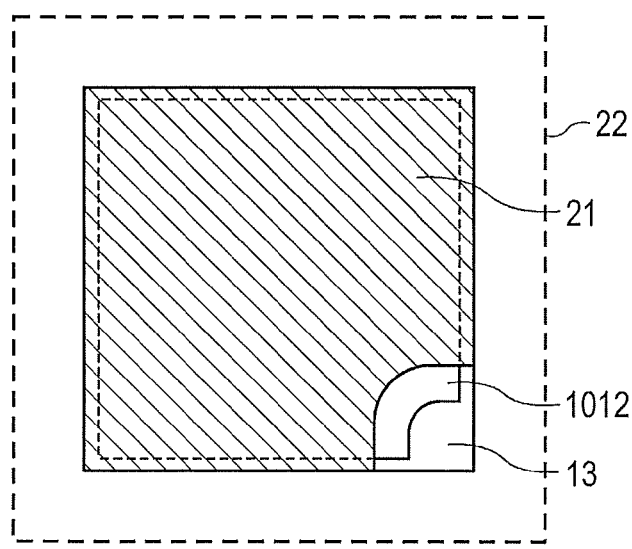
FIG. 1B shows a schematic plan view of the semiconductor chip from FIG. 1A.

A luminescence conversion element 20 is applied to the outer surface 101. The luminescence conversion element 20 contains a first lamina 21 and a second lamina 22. The first lamina 21 is fixed on the outer surface 101 of the semiconductor body 10 by an adhesive layer 30. At that side of the first lamina 21 facing away from the semiconductor body 10, the first lamina is connected to the second lamina 22. In FIG. 1B, which shows a plan view of the semiconductor chip 1, the second lamina 22 is depicted merely in the form of a dashed contour to enable better illustration of the underlying structures.

The first lamina 21 covers a first partial region 1011 of the outer surface 101 and leaves free a second partial region 1012 of the outer surface 101. In other words, in a plan view of the first lamina 21, the first partial region 1011 is covered by the first lamina and the second partial region 1012 is not covered by the first lamina 21 (see FIG. 1B).

In the case of semiconductor body 10, an electrical connection location 13 is arranged on the second partial region 1012 of the outer surface 101 of the semiconductor layer sequence 11. By way of example, this involves a bonding pad. The electrical connection location 13 can partly or completely cover the second partial region 1012. In one configuration, the electrical connection location 13, proceeding from the second partial region 1012, also extends into the first partial region 1011.

The second lamina 22 laterally projects beyond the semiconductor body 10 and the first lamina 21. In particular, a section of the second lamina 22 covers the second partial region 1012 of the radiation-emitting outer surface 101 of the semiconductor body 10.

The semiconductor body 10 has in plan view, for example, a square contour having an edge length of 1 mm. The second lamina 22 has, for example, likewise a square contour having an edge length of 1.3 mm and is arranged concentrically above the semiconductor body 10.

In the case of this semiconductor chip, both the first lamina 21 and the second lamina 22 contain a phosphor, in particular the same phosphor. By way of example, the materials indicated further above are suitable for the phosphors. By way of example, the two laminae 21 and 22 are in each case mechanically self-supporting layers composed of a silicone material into which the phosphor is embedded in the form of inorganic phosphor particles. Alternatively, it is also conceivable for one of the laminae 21, 22 or both laminae 21, 22 to be produced from a ceramic material, in particular from a phosphor ceramic.

The phosphor particles have, for example, a median diameter (also called $d_{50}$) of 15 μm or more, preferably of 20 μm or more, for example, of 30 μm or more. The median diameter has, for example, a value of 50 μm or less. The median diameter can be determined, for example, on the basis of a micrograph of a cross section of the respective lamina 21, 22. In the case of non-spherical phosphor particles, the diameter used can be, for example, the diameter of the smallest sphere (the smallest circle in the micrograph) which completely contains the respective particle. With phosphor particles having such diameters, the ratio of absorption to scattering during the interaction of the particles with the primary light is particularly high. Phosphor particles having these diameters are also suitable for all other configurations of the luminescence conversion element 20.

The first lamina has, for example, a thickness of 50 200 μm, in particular 100 to 150 μm. The same thicknesses are also suitable for the second lamina 22. The adhesive layer 30 has, for example, a thickness of approximately 1 μm to 10 μm.

The second lamina 22 is arranged at a predefined distance from the semiconductor body 10 by the first lamina 21. The second lamina 22, the first lamina 21 and the semiconductor body 10 form a cavity containing the second partial region 1012 of the light-emitting outer surface 101 of the semiconductor body 10.

The concentration C of the phosphor in the first lamina 21 is chosen such hat part of the primary radiation generated by the semiconductor body 10 and coupled in at a base surface of the lamina 21 facing the semiconductor body 10 leaves the first lamina 21 again at the top surface thereof facing away from the semiconductor body 10. The proportion is, for example, 10% or more in one configuration 20% or more, in particular relative to the radiation power. The concentration of the phosphor in the first lamina is, for example, 70% by weight or less, and in one configuration it is 50% by weight or less.

The phosphor proportion in percent by volume, i.e., % by volume, may correspond to between approximately one quarter and approximately one sixth of the proportion in percent by weight, i.e., % by weight, inclusive of the limits. The density of the phosphor is, for example, approximately 4 g/cm³ to 6 c/cm³ and the density of the matrix material into which the phosphor is embedded has a density of approximately 1 g/cm³. A phosphor proportion of 80% by weight in the first layer in this case corresponds to a proportion of approximately 15-20% by volume.

The second lamina is absorbent for the primary radiation by the phosphor. In particular, the second lamina 22 is provided to absorb primary light emitted by the second partial region 1012 of the outer surface 101 of the semiconductor body 10. With the edge region laterally projecting beyond the semiconductor body 10, the second lamina 22 also absorbs at least part of a primary light emitted, for example, by the side surfaces of the semiconductor body 10. Primary light which is scattered, for example, in the first lamina 21 without wavelength conversion, with the result that it emerges from the side flanks of the first lamina 21, also impinges, for example, on the overhanging edge region of the second lamina 22, where it can be absorbed by the latter.

Figure 2:
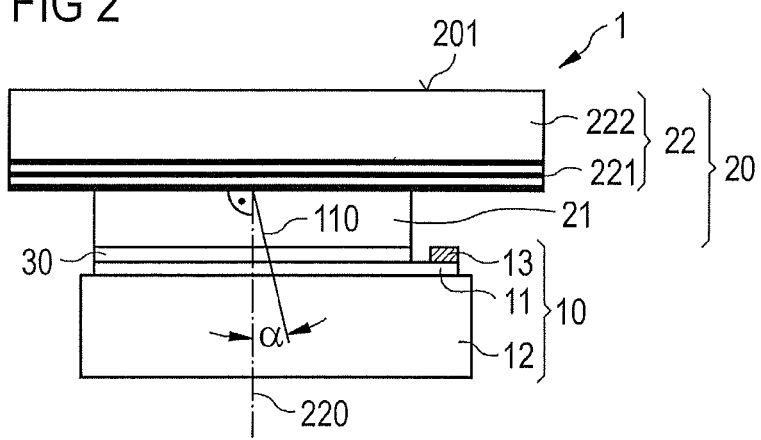
FIG. 2 shows an optoelectronic semiconductor chip in accordance with a second example in a schematic sectional illustration.
Figure 16:
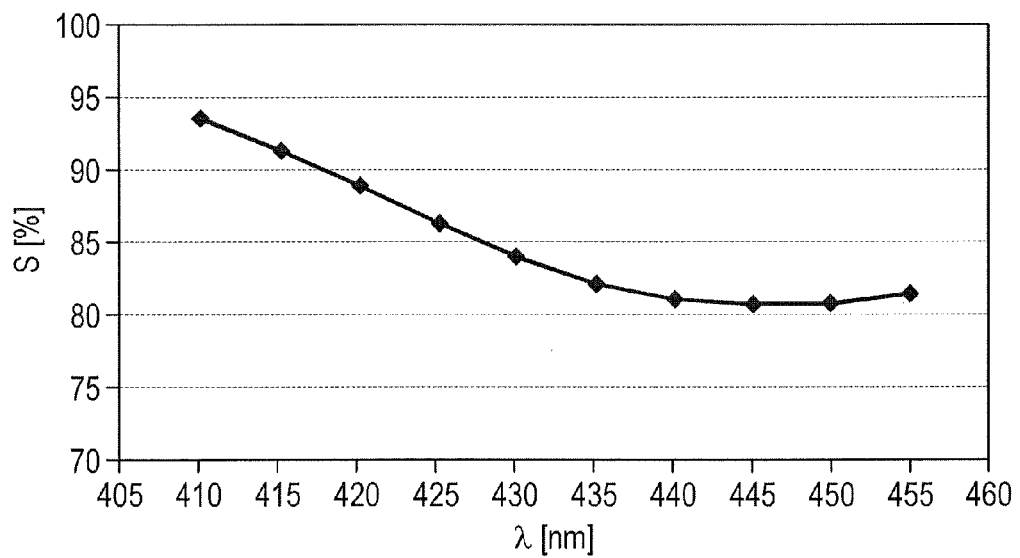
FIG. 16 shows the dependence of the color saturation on the excitation wavelength in the case of the semiconductor chip in accordance with the first example.

FIG. 16 shows the dependence of the color saturation S of the luminescence conversion element 20 on the wavelength λ of the emission maximum of the primary light emitted by the semiconductor body 10. FIG. 16 reveals that the color saturation S that can be obtained increases as the wavelength λ decreases, with an otherwise identical construction of the semiconductor chip 1. To put it another way, the phosphor concentration C required to obtain a predefined color saturation S is all the lower, the shorter the wavelength λ of the emission maximum of the primary light. In the case of semiconductor chip 1, the semiconductor body 10 emits, for example, primary light having an emission maximum at a wavelength of 440 nm or less; by way of example, the intensity maximum of the primary light is 400 nm. FIG. 2 shows a second optoelectronic semiconductor body in a schematic sectional illustration. The second semiconductor body 1 differs from the first semiconductor body in that the second lamina 22 of the luminescence conversion element 20 contains no phosphor. Rather, the second lamina 22 indicates that the second semiconductor chip 1 has a wavelength-selective filter 221. The latter is produced on a carrier, for example, a glass lamina 222.

The wavelength-selective filter 221 has in particular a layer stack whose layers consist alternately of a material having a high refractive index and a material having a low refractive index. Such layer stacks are known and, therefore, are not explained in any greater detail at this juncture.

In this case, the layer stack contains 10 to 20 layer pairs having an $SiO_2$ layer (refractive index n=1.4) and an $Si_3N_4$ layer (refractive index n=1.8). As an alternative to the $Si_3N_4$ layers, the layer stack can contain titanium oxide, tantalum oxide or hafnium oxide layers. In this way, the layer stack is designed such that it has a high reflectivity for the primary light emitted by the semiconductor body 10.

Interference filters, like such wavelength-selectively reflecting layer stacks, are reflective depending on the angle of incidence for different spectral ranges. In this case, the layer stack is designed such that primary light impinging at an angle of 0° to at least 20° with respect to the surface normal on the base surface of the second lamina 222 facing the semiconductor body 10 is reflected by the layer stack 221 with a reflection coefficient of 95% or more, in particular of 99% or more. FIG. 2 depicts by way of example a light ray 110 of the primary light which impinges on the second lamina 22 at an angle α with respect to the surface normal 220.

Figure 18:
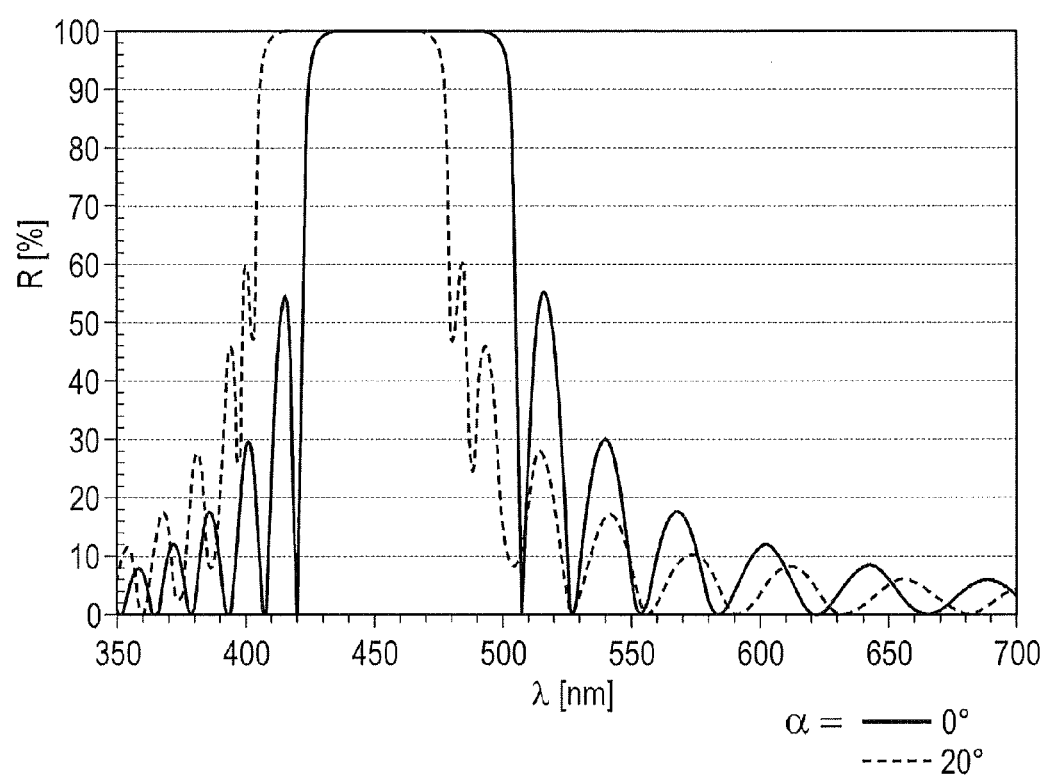
FIG. 18 shows the reflectivity of the layer stack of the semiconductor chip in accordance with the second example as a function of the wavelength.

FIG. 18 shows the dependence of the reflectivity R of the wavelength-selective filter 221 as a function of the wavelength λ for an angle of incidence of 0° (solid line) and an angle α of incidence of 20° (dashed line).

At an angle of incidence of α=0°, the wavelength-selective filter 221 has a reflectivity R of almost 100% for light having a wavelength of between approximately 430 nm and approximately 500 nm. For an angle of incidence of α=20°, this range of high reflectivity is shifted toward shorter wavelengths. In the case of this angle of incidence, the wavelength-selective filter 221 has a range having a reflectivity of almost R=100%, for example, of 415 nm to 470 nm. Consequently, the wavelength-selective filter 221 reflects primary light having a wavelength of 530 to 570 nm which impinges on the second lamina 20 at an angle α of 0 to 20° with respect to the surface normal 220 with a reflectivity of more than 99%. Expediently, an emission maximum of the semiconductor body 10 in the case of the second semiconductor chip 1 has an emission maximum with a wavelength within this wavelength range. By way of example, the wavelength of the emission maximum has a value of 440 to 460 nm.

As in the case of the semiconductor chip in accordance with the first example, the first lamina 21 contains a phosphor that absorbs primary light of the semiconductor body 10 and emits wavelength-converted secondary light. Expediently, the secondary light has an intensity maximum at a wavelength for which the wavelength-selective filter layer 221 has a low reflection coefficient, for example, in the orange spectral range, for example, at approximately 590 nm.

In this way, the luminescence conversion element 20 emits secondary light. In this case, the secondary light is generated in the first lamina 21 and passes at least partly through the second lamina 22 with the wavelength-selective layer stack 221 such that it emerges from the second lamina 22 and thus from the luminescence conversion element 20 on the side facing away from the semiconductor body 10 and the first lamina 21.

With the wavelength-selective filter 21, however, the luminescence conversion element 20 is designed such that it emits, at its surface facing away from the semiconductor body 10 and emits secondary light, at most 1% of the radiation power of a primary light coupled in through its surface facing the semiconductor body 10.

The first lamina 21 is designed such that it transmits a portion of the primary light emitted by the semiconductor body 10, which portion enters into the first lamina 21 at the base surface thereof facing the semiconductor body 10, with the result that the portion impinges on the wavelength-selective filter 221. For this purpose, the first lamina 21 in the case of this semiconductor body comprises inorganic phosphor particles in a plastic matrix, for example, a silicone matrix, in a concentration C of approximately 40% by weight. At the wavelength-selective filter 221, the primary light is reflected back into the first lamina 21 and is available there again for wavelength conversion.

We established that in this way it is possible to obtain a semiconductor chip that emits secondary light with particularly high efficiency $\eta$.

Figure 15:
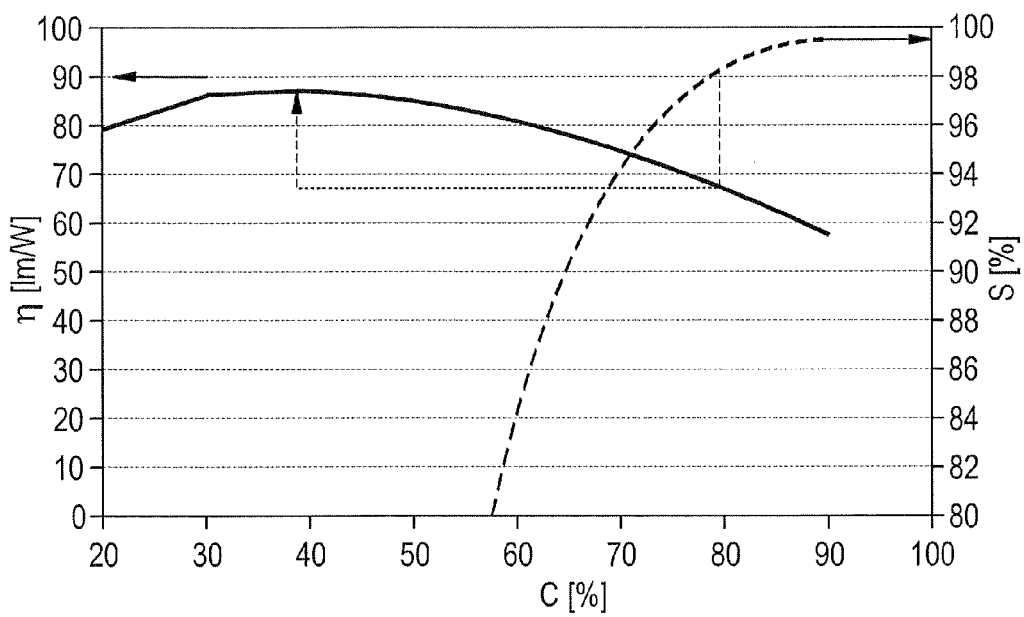
FIG. 15 shows the dependence of the color saturation and the efficiency on the phosphor concentration in the case of the semiconductor chip in accordance with the second example.

FIG. 15 illustrates this by representing the dependence of the efficiency $\eta$ in lumens per watt on the concentration of the phosphor in % by weight (solid curve) and also the color saturation S of the light emitted by the first layer 21 likewise as a function of the concentration C (dashed curve).

In this case, the color saturation S can be determined by the CIE standard colorimetric system, for example, by placing a straight line from the white point W of the CIE color space to the color locus corresponding to the mixed light comprising primary and secondary light which is emitted by the first layer 21. The straight line intersects the spectrum locus, which delimits the color space in the CIE diagram, at a marginal point corresponding to a specific spectral color. The ratio of the distance between the white point and the color locus and the distance between the white point and the marginal point is the measure of saturation.

It can be seen in FIG. 15 that the efficiency $\eta$ decreases as the phosphor concentration C increases. This is brought about by the increased scattering at the phosphor particles. At the same time, however, the color saturation increases as the phosphor concentration increases.

In the case of this semiconductor chip, the first lamina 21 has an efficiency of more than 85% (indicated by the vertical arrow in FIG. 15). To obtain the same color saturation with a phosphor but without a wavelength-selective filter layer 221, a phosphor concentration of approximately 80% by weight would be necessary, which would lead to a loss of the efficiency $\eta$ to below 70% (indicated by the dotted lines in FIG. 15).

Moreover, with low phosphor concentrations of, for example, at most 50% by weight, in particular of 40% by weight or less, it is possible to obtain an advantageously low viscosity of the mixture of phosphor particles (density of the phosphor material, e.g., approximately 4-6 g/cm$^3$) and matrix material (density, e.g., approximately 1 g/cm$^3$) during the production of the lamina 21. Thus, the processing of the mixture for producing the lamina, for example, when passing through a nozzle, is particularly simple.

By way of example, the second semiconductor chip 1 emits secondary light having a wavelength in the yellow-orange spectral range. In particular, the spectral color having a wavelength of approximately 590 nm corresponds to the secondary light emitted by the semiconductor chip.

Figure 17:
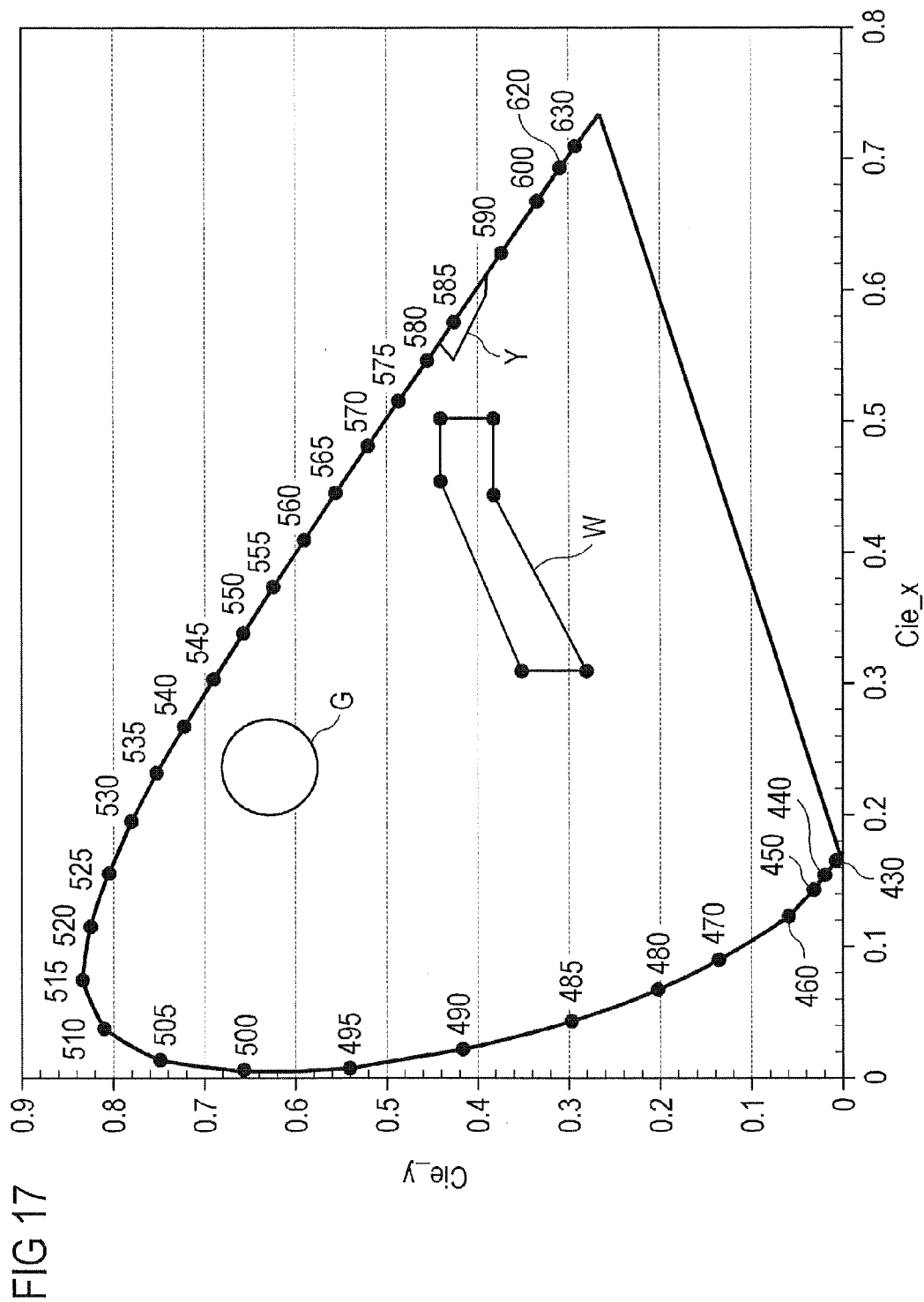
FIG. 17 shows the CIE diagram with different regions of color loci.

FIG. 17 shows the CIE diagram. The CIE diagram, also called CIE standard chromaticity diagram, serves to represent the x- and y-coordinates (designated by Cie_x and Cie_y in the diagram) of the standard chromaticity system developed by the International Commission on Illumination (CIE, Commission internationale de l'éclairage) in 1931 and is known.

FIG. 17 depicts a green color locus region G, a white color locus region W and an orange color locus region Y in the CIE diagram. The orange color locus region Y is bounded in the CIE diagram by the points having the (x; y) coordinates (0.544; 0.423), (0.597; 0.390), (0.610; 0.390) and (0.560; 0.440) and indicates the color loci which are provided for flashing luminaires of motor vehicles in accordance with the specifications provided therefor, in particular the so-called "ECE" regulations. The white region W is spanned by the points having the (x; y) coordinates (0.310; 0.283), (0.443; 0.382), (0.5; 0.382), (0.5; 0.440) (0.453; 0.440) and (0.310; 0348) and indicates the white color loci provided in the automotive sector. The green region G is a substantially circular region around the coordinates (0.25; 0.625) having a diameter of approximately 0.08 and indicates color loci which are used for green light sources in projection devices based on semiconductor chips.

FIGS. 3A to 3E show schematic sectional illustrations through second laminae 22 in accordance with different variants of the luminescence conversion element of the semiconductor chip in accordance with the second example.

In the case of the second laminae 22 in accordance with FIG. 3A, the wavelength-selective filter 221 is fitted to that side of the carrier 222 which faces away from the semiconductor chip 10; by way of example, the wavelength-selective filter 221 contains the coupling-out surface 201 of the luminescence conversion element 20 provided for secondary light emission. The filter 221 can once again be designed as a dielectric layer stack, as described in the case of the semiconductor chip 1 of the second example. In addition, the layer stack can comprise further layers for forming an antireflection layer.

FIG. 3B shows a variant of the second lamina 22 in which the wavelength-selectively reflecting layer stack 221 is applied on a carrier 222, which, in contrast to the carrier of the semiconductor chip in accordance with the second example and the carrier in FIG. 3A, is not designed to be transparent or scattering, but rather contains a dye. In this way, the second lamina 22 in accordance with the variant in FIG. 3B contains two wavelength-selective filters, namely the selectively reflecting layer stack 221 and the colored carrier 222.

The dye in the carrier is selected, for example, such that it is absorbent for primary light and transmissive at least for a spectral subrange of the secondary light. For example, in the case of a semiconductor body 10 that emits blue primary light and a first lamina 21 that emits orange secondary light, the dye is expediently a yellow, yellow-orange, orange or orange-red dye. In one development, the dye is provided to remove a short-wave or a long-wave spectral component of the secondary light emitted by the first lamina 21.

FIG. 3C shows a schematic sectional illustration through a third variant of the second lamina 22, in which, on that side of a transparent carrier body 222 which faces the semiconductor body 10, an absorbent filter layer 223 having a dye is applied and a wavelength-selectively reflective layer stack 221 is applied to the dye layer 223. The dye of the dye layer 223 can be analogous to the dye of the colored carrier 222 of the second variant. The dye layer 223 differs from the colored carrier 222 of the second variant, for example, in that it is not mechanically self-supporting by itself.

FIG. 3D shows a fourth variant of the second lamina 22 in a schematic sectional illustration. In this variant, as in the example in accordance with FIG. 2, the wavelength-selectively reflecting filter 221 is arranged on that side of the transparent carrier 222 which faces the semiconductor body 10. As in the third variant, a dye layer 223 is arranged on that side of the transparent carrier 222 facing away from the semiconductor body 10. The dye layer is covered with a sealing layer 224, which reduces the risk of the dye layer 223 being scratched by mechanical action.

In all variants of the second lamina which contain an absorbent wavelength-selective filter having a dye, the wavelength-selectively reflecting layer stack 221 can also be omitted.

FIG. 3E shows a fifth variant of the second lamina 222, in which the carrier 222 is provided with the wavelength-selectively reflecting layer 221 at its side facing the semiconductor body 10 and with an antireflection layer 225 at its side facing away from the semiconductor body 10. The antireflection layer comprises, like the wavelength-selectively reflecting filter layer 221, a layer stack composed of layers having alternately high and low refractive indices. However, the layer thicknesses and layer sequence of the antireflection layer stack 225 are expediently chosen such that destructive interference occurs for as many wavelengths and angles of incidence as possible. The production of such antireflection layer stacks with the choice of suitable refractive indices, layer thicknesses and layer sequences is known in principle to the person skilled in the art and will therefore not be explained in greater detail at this juncture.

Figure 4A:
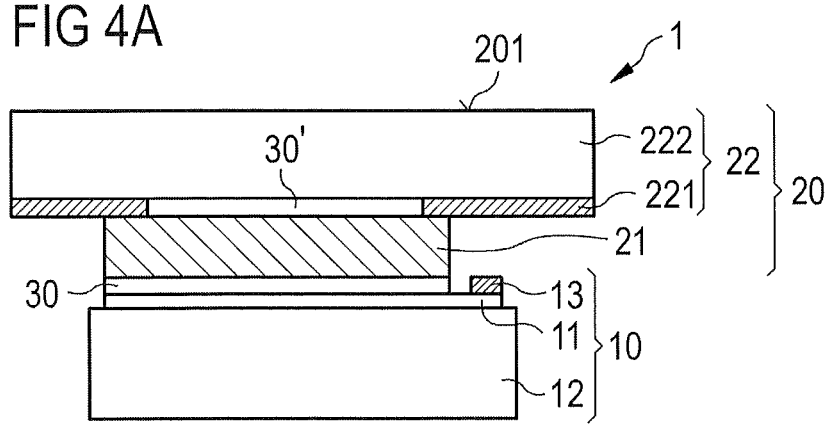
FIG. 4A shows a schematic sectional illustration of an optoelectronic semiconductor chip in accordance with a third example.
Figure 4B:
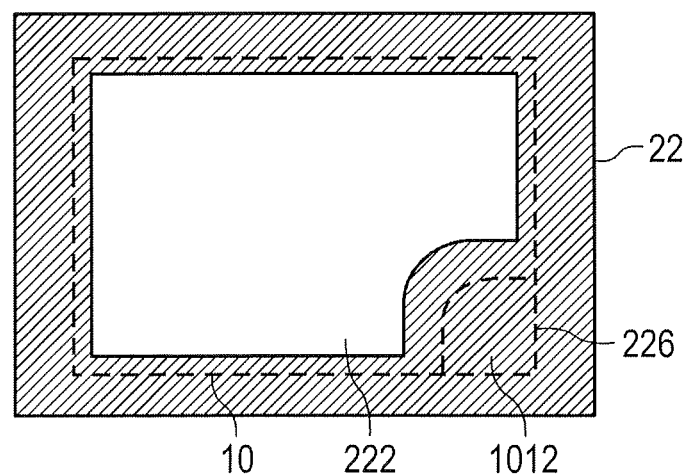
FIG. 4B shows a schematic plan view of the semiconductor chip in accordance with FIG. 4A.

FIGS. 4A and 4B show an optoelectronic semiconductor chip in accordance with a third example in a schematic sectional illustration and a schematic plan view. The semiconductor chip 1 in accordance with the third example differs from the semiconductor chip in accordance with the second example in that the second lamina 22 has a reflector layer 226 instead of a wavelength-selective filter 221, the reflector layer being designed for reflecting primary light and secondary light.

In a plan view of the light coupling-out surface 201 of the luminescence conversion element 20, the reflector layer 226 arranged at that side of a transparent carrier 222 which faces the semiconductor body 10 covers a circumferential edge region of the semiconductor chip 10 and in particular the second partial region 1012, not covered by the first lamina 21, of the outer surface 101 of the semiconductor body 10 that is provided for emission of primary light. A central region of the semiconductor body 10 is not covered by the reflector layer 226.

The reflector layer 226 contains, for example, a metal such as aluminum and/or silver or consists of at least one metal. In one variant, the reflector layer 226 is replaced by a layer that absorbs primary and secondary light, for example, a black color layer. The reflector layer 226 or the absorbent layer is expediently substantially non-transmissive both to the primary light emitted by the semiconductor body 10 and to the secondary light emitted by the first lamina 21.

The semiconductor chip 1 is provided, for example, to emit mixed light comprising primary light originating from the semiconductor body 10 and secondary light originating from the first lamina 21 from the coupling-out surface 201. By way of example, the mixed light is white light comprising blue primary light of the semiconductor body 10 and yellow secondary light of the first lamina 21. Alternatively, the semiconductor chip 1 can also be fully converting like the semiconductor chips 1 in accordance with the previous examples. The reflector layer 226 reduces the risk of colored edges in which, for example, the color of the primary light predominates, in the area of the second partial region 1012 of the outer surface 101 of the semiconductor body 10 and in the circumferential edge region of the semiconductor body 10.

Figure 4C:
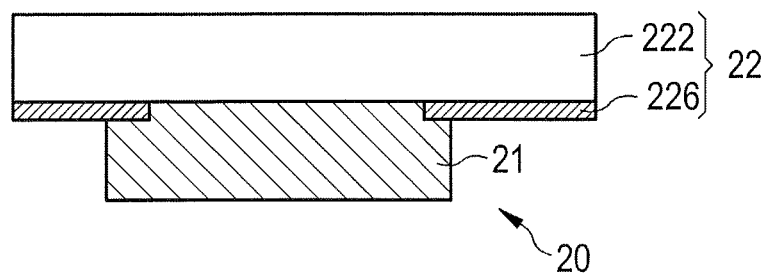
FIG. 4C shows a schematic sectional illustration of a luminescence conversion element for a variant of the semiconductor chip in accordance with the third example.

FIG. 4C shows a variant of the luminescence conversion element 20 for the third semiconductor chip 1. In this variant, the first lamina 21 is not initially produced separately and subsequently fixed to the second lamina 22 by an adhesive layer 30, as illustrated in the case of the third semiconductor chip 1 in FIG. 4A. Instead, the first lamina 21 is produced directly on the second lamina 22 and adjoins the carrier 222 in the region not covered by the reflector layer 26. By way of example, the matrix material provided with the phosphor particles is applied to the second lamina 22 and cured in situ. The same materials as for the separately produced first lamina 21 are suitable in this case. By way of example, the matrix material is an epoxy resin or silicone resin which can also be used for the adhesive 30' in the case of the luminescence conversion element 20 in accordance with FIG. 4A.

Figure 5:
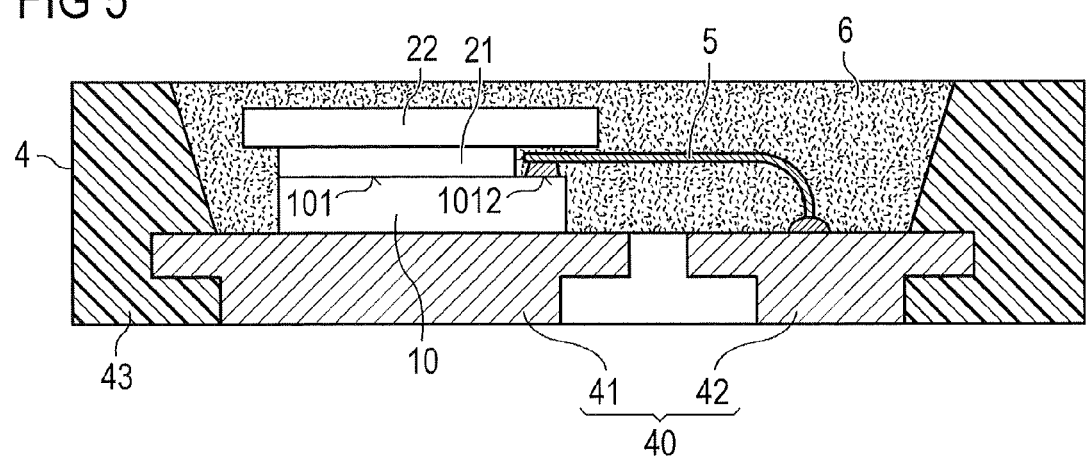
FIG. 5 shows a schematic sectional illustration through an optoelectronic component in accordance with the first example.

FIG. 5 shows a schematic sectional illustration of an optoelectronic component in accordance with a first example.

The optoelectronic component comprises a carrier element in the form of a main housing 4, which comprises a leadframe 40, for example, which is encapsulated with a housing main body 43 by injection molding.

The main housing 4 has a recess. A first section 41 and a second section 42 of the leadframe 40 are exposed at a bottom area of the recess. An optoelectronic semiconductor chip is fixed on the first section 41. This can be, for example, a semiconductor chip in accordance with one of the examples described above, for example, the semiconductor chip in accordance with the first example.

The semiconductor chip has a semiconductor body 10, which is electrically conductively connected to the first section 41 of the leadframe 40, for example, by being fixed thereon by solder or an electrically conductive adhesive. The first lamina 21 is fixed on the side 101 of the semiconductor body 10 facing away from the first section, the first lamina leaving free the second partial region 1012 of the outer surface 101 of the semiconductor body 10.

An electrical connection conductor 5 is fixed to the second partial region 1012. By way of example, a bonding wire is used as electrical connection conductor 5. A first end of the bonding wire is fixed to the electrical connection location 13, for example, by the so-called "ball bonding" method. The second end of the bonding wire is drawn alongside the semiconductor chip 1 onto the second section 42 of the leadframe and electrically conductively fixed there. The method of "ball bonding," for example so-called "thermosonic ball wedge bonding," is known and will therefore not be explained in greater detail at this juncture. The bonding wire has, for example, a thickness of 50 μm or less, for example, a thickness of 30 to 40 μm.

The second lamina 22 is arranged on the first lamina 21 and is spaced apart from the semiconductor body 10 by the first lamina 21 such that it covers the second partial region 1012 of the outer surface 101 of the semiconductor body which emits primary light and also a partial region of the bonding wire applied thereto, and in particular the bonding ball.

The thickness of the first lamina 21 is 100 μm to 200 μm, for example, 100 to 150 μm. In particular, the thickness of the first lamina 21 is greater than the height by which the bonding wire projects beyond the outer surface 101 of the semiconductor body 10 in the region covered by the second lamina 22, with the result that the second lamina 22 is spaced apart from the bonding wire 5.

The recess of the main housing 4 is filled with a, for example, transparent encapsulation compound 6. The encapsulation compound 6 encloses the semiconductor chip 1 and the bonding wire 5.

FIGS. 6A to 6D show schematic sectional illustrations of different stages of a method of producing an optoelectronic component in accordance with a second example.

The method involves providing a carrier element 4. By way of example, the carrier element 4 is a circuit board, for example, a printed circuit board. The conductor tracks of the circuit board 4 are omitted in FIGS. 6A to 6D to simplify the illustration. An optoelectronic semiconductor body 10 is mounted onto the circuit board 4, for example, soldered onto a conductor track (see FIG. 6A).

Afterward, the first lamina 21 is adhesively bonded by an adhesive layer 30 onto the semiconductor body 10 at its outer surface 101 facing away from the circuit board 4 and emits the primary light. By way of example, the first lamina 21 consists of diffuser particles such as $TiO_2$ particles which are embedded into a matrix material, for example, a silicone material. The adhesive layer consists, for example, of the silicone material or of a silicone material into which diffuser particles without a wavelength conversion property are likewise embedded. The first lamina 21 has a thickness D of 100 to 150 μm, for example.

The first lamina 21 is placed onto the semiconductor body 10, for example, by a so-called "pick-and-place" method. By way of example, it is picked up by a gripping arm and positioned and placed on the chip with the aid of a camera system.

Expediently, the first lamina 21 is prefabricated for this purpose before placement. In particular, the matrix material is a curable material, for example, an epoxy resin or a silicone resin which in the cured state is contained in the lamina 21 when the latter is applied to the semiconductor body 10.

The first lamina 21 is produced, for example, by screen printing, stencil printing, casting or sintering method. With screen printing, the geometrical form of the lamina 21 can advantageously be obtained in one production step. With a combined stencil/screen printing method, a particularly high structural fidelity can advantageously be obtained.

In one configuration, to produce the first lamina 21, by way of example, first a composite is produced, which is singulated to form a plurality of first laminae 21, for example, by stamping, cutting, sawing or laser separation. In this case, separating traces can be produced at the side surfaces of the first laminae 21, material residues of the material removed between the individual laminae remain on the laminae and/or the laminae can, for example, in the case of laser separation be produced with oblique side flanks.

Such methods of producing and processing the first laminae 21 are also possible for all other configurations of first and second laminae 21, 22.

Advantageously, the required positioning accuracy when placing the second lamina 22 is in each case considerably lower than when placing the first lamina. A pick-and-place method, for example, can therefore be carried out at higher speed in the case of the second lamina 22 than in the case of the first lamina 21.

In one variant of the method, first, the semiconductor body 10 connects to the first lamina 21 and subsequently fixed on the carrier element 4. By way of example, in this case, the first lamina 21 can be deposited directly onto the semiconductor body 10 and be cured there.

In the subsequent method step, illustrated in FIG. 6C, an electrical connection conductor 5, in particular a bonding wire, is fixed on the second partial region 1012 of the outer surface 101, the second partial region being left free by the first lamina 21 with a ball bonding method. The connection conductor is lead alongside the semiconductor body 10 and connected to a second conductor track of the carrier element 4. In this case, the bonding wire 5 does not project beyond the first lamina 21, for example, in a direction away from the circuit board 4.

In a subsequent method step, the second lamina 22, for example, likewise by an adhesive layer, is fixed on the first lamina 21. The second lamina 22 covers the second partial region 1012 provided with the bonding wire 5.

The second lamina 22 contains phosphor particles of an inorganic phosphor in a plastic matrix, for example, an epoxy resin matrix or silicone matrix. Primary light emitted by the semiconductor body 10 is at least partly wavelength-converted to secondary light by the phosphor contained in the second lamina 22, the materials described further above being suitable, for example, for the phosphor. In the case of the semiconductor chip 1 of the second optoelectronic component, the first lamina serves as a spacer for the second lamina 22 and for homogenizing the primary light passing through the first lamina 21.

The thickness of the second lamina 22 is, for example, likewise 100 μm or more, for example, 100 to 300 μm. In this case, it has a thickness of 150 μm. In this way, the second lamina 22 is mechanically self-supporting and also has a sufficient dimensional stability at the regions projecting laterally beyond the semiconductor chip 10 and/or beyond the first lamina 21.

FIGS. 7A to 7D show schematic sectional illustrations of different stages of a method of producing an optoelectronic component in accordance with a third example.

In contrast to the component in accordance with the second example, a main housing having a recess is provided as carrier element 4, as in the case of a first component. To simplify the illustration, the leadframe 40 is omitted in FIGS. 7A to 7D.

Figure 7A:
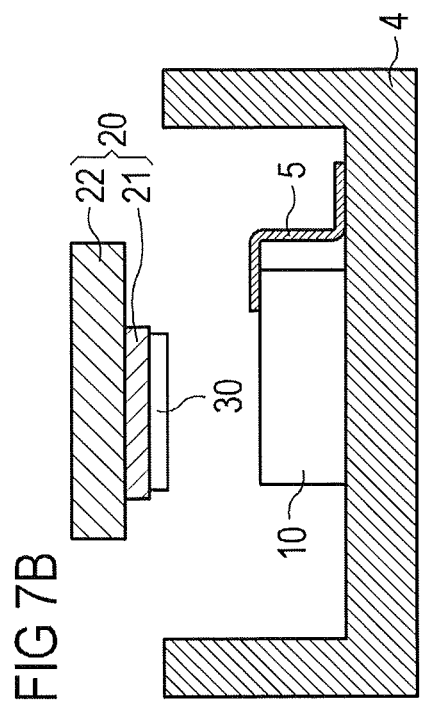
FIGS. 7A to 7D show schematic sectional illustrations of a method of producing an optoelectronic component in accordance with the third example.

FIG. 7A shows a stage of the method in which the optoelectronic semiconductor body 10 is mounted into the recess of the main housing. This can be done, for example, by soldering or adhesive bonding, as explained in connection with the component in accordance with the second example.

In the method stage illustrated in FIG. 7A, the electrical connection conductor 5 is also already fixed to the electrical connection location 13 at the outer surface 101 of the semiconductor body 10 provided for emitting primary light and also at the leadframe of the main housing 4. In contrast to the component in accordance with the second example, in this case a conductor ribbon, rather than a bonding wire, is used as connection conductor 5. A conductor ribbon has, for example, a rectangular cross section with a height which is, in particular, at most 30 μm. To put it another way, the conductor ribbon is a strip-shaped metal foil.

In this case, the conductor ribbon 5 is fixed to the connection location 13 of the semiconductor body 10 and to the leadframe 40 by a so-called "ribbon bonding" method. In the ribbon bonding method, which is known and will therefore not be explained in greater detail at this juncture, no bonding ball is produced, with the result that the electrical connection conductor 5 in the case of this component projects only comparatively slightly beyond the semiconductor body 10, for example, by less than 50 μm.

Figure 7B:
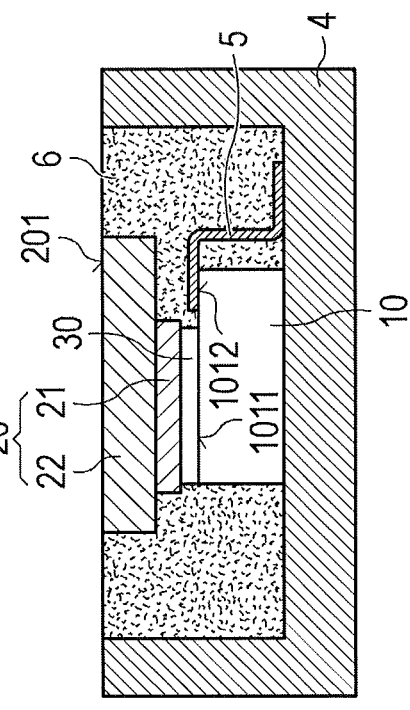

FIG. 7B shows a subsequent method step in which the already completed luminescence conversion element 20 comprising the first lamina 21 and the second lamina 22 is placed on the semiconductor body 10 by a pick-and-place method. By way of example, the first lamina 21 of producing the luminescence conversion element 20 is deposited directly on the second lamina 22. Advantageously, during the assembly of the component, only an alignment and transfer step is required for fixing the luminescence conversion element 20.

To fix to the semiconductor body 10, the luminescence conversion element is provided with an adhesive layer 30. Alternatively, the adhesive layer 30 can also be applied on the semiconductor body 10, for example, by dropwise application of a silicone drop. As in the case of the semiconductor chip 1 of the component in accordance with the second example, the first lamina 21 contains diffuser particles in a silicone matrix and the second lamina 22 contains phosphor particles in a silicone matrix.

Figure 7C:
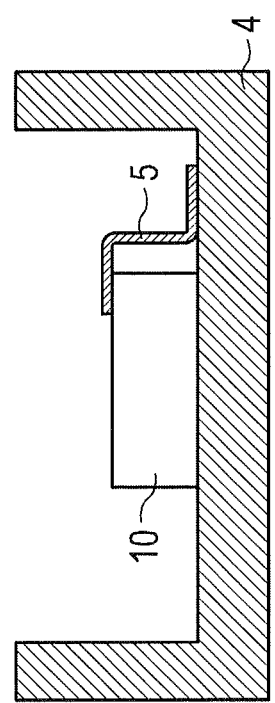

FIG. 7C shows a subsequent method stage in which the luminescence conversion element 20 is fixed on the semiconductor body 10. On account of the small height of the conductor ribbon 5, the height required for the first lamina 21 is particularly small in the case of the semiconductor chip 1 of the third component. By way of example, the first lamina 21 in this case has a thickness D of 50 μm.

Figure 7D:
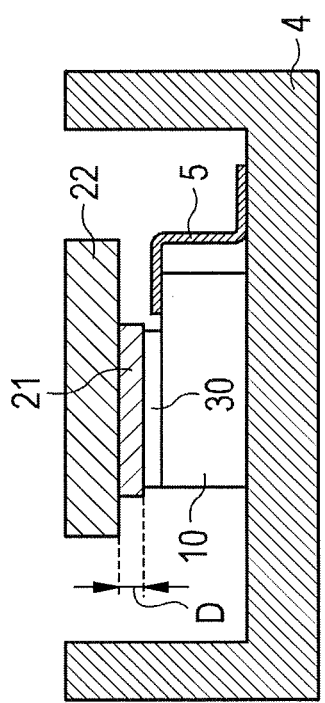

FIG. 7D shows the completed component in which the recess of the main housing 4 is filled with a reflective encapsulation compound 6. By way of example, the encapsulation compound is a silicone resin filled with titanium dioxide particles.

The encapsulation compound surrounds the semiconductor body 10, the adhesive layer 30, the first lamina 21, the second lamina 22 and also the conductor ribbon 5. In this case, the interspace between the second partial region 1012 of the outer surface 101 of the semiconductor body 10 and the second lamina 22 is also filled with the reflective encapsulation compound. The coupling-out surface 201 of the luminescence conversion element 20 is expediently not covered by the reflective encapsulation compound 6.

For this semiconductor component, a bonding wire 5 can also be used as electrical connection conductor. Equally, in the case of the first and second optoelectronic components, a conductor ribbon can be used as electrical connection conductor 5. If a conductor ribbon is replaced by a bonding wire in one of the components, if appropriate the layer thickness D of the first lamina should correspondingly be increased.

FIG. 8 shows a schematic sectional illustration through an optoelectronic component in accordance with a fourth example. The latter differs from the component in accordance with the first example in that the electrical connection of the semiconductor body 10 is effected by two bonding wires 5a and 5b. Such a connection is expedient, for example, if the semiconductor body 10 has an electrically insulating substrate 12.

For this purpose, the optoelectronic semiconductor body 10 has two electrical connection locations 13 at its side facing the luminescence conversion element 20, the electrical connection locations being provided in particular for the n-side and p-side contact-connection of the semiconductor layer sequence 11. The first connection conductor 5A connects to the first section 41 of the leadframe 40 and one of the electrical connection locations, and the second electrical connection conductor 5B connects to the second electrical connection location and the second section 42 of the leadframe. In this case, the connection is effected in a manner analogous to that described in the case of the previous examples.

This component differs from the component in accordance with the first example, moreover, in that an optical element 7, for example, a planoconvex lens, is closed onto the main housing 4 and in particular covers the opening of the recess of the main housing 4.

As in the case of the components in accordance with the first and third examples, the luminescence conversion element 20 is spaced apart from the side areas of the recess of the main housing 4.

FIG. 9 shows an optoelectronic component in accordance with a fifth example in a schematic sectional illustration.

The component differs from the component in accordance with the first example in that the second section 42 of the leadframe is not contained in a bottom area of the recess of the main housing 4. Instead, the second section is arranged in a manner elevated relative to the bottom area. This arrangement is also suitable for the other components comprising a main housing 4. A second section 42 of the leadframe 40 that is exposed in the bottom area as in the case of the component in accordance with the first example is also suitable for this component.

In the case of this component, the semiconductor body 10 is laterally enclosed with a reflective encapsulation compound 6. The reflective encapsulation compound 6, which contains, for example, reflective particles, for instance titanium dioxide particles, covers in particular the side flanks of the semiconductor body 10 at least partly. It may cover the side surfaces up to the outer surface 101 of the semiconductor body 10 provided to emit primary radiation. The section of the recess above the reflective encapsulation compound 6 can be either gas-filled, for example, air-filled or filled with a translucent or transparent further encapsulation compound. As in the case of the component in accordance with the fourth example, the opening of the recess of the main housing 4 is covered with a lens 7.

Figure 10:
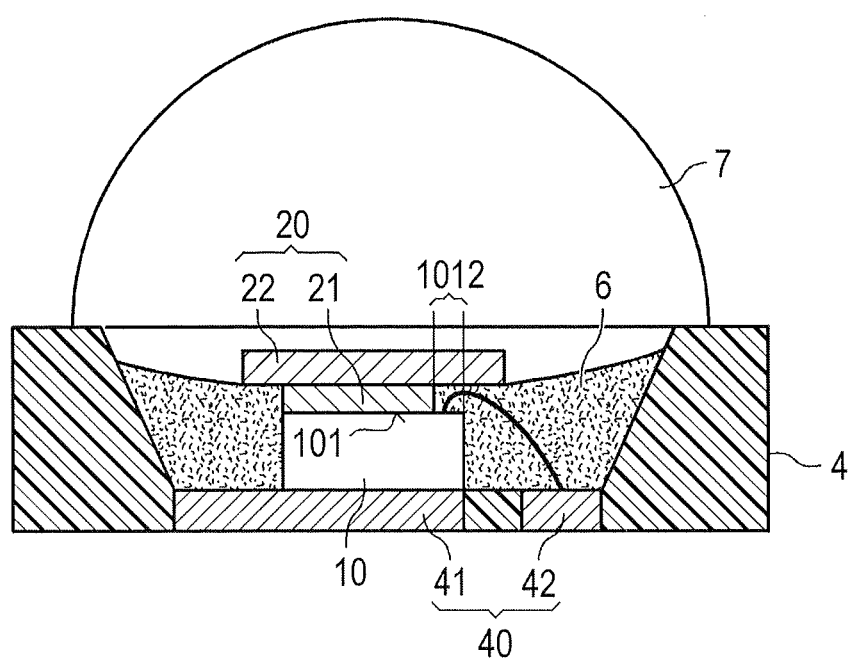
FIG. 10 shows a schematic sectional illustration through an optoelectronic component in accordance with a sixth example.

FIG. 10 shows a schematic sectional illustration of a component in accordance with a sixth example, which substantially corresponds to the component in accordance with the first example. In a departure therefrom, the opening of the recess of the main housing 4 is in turn covered with a convex lens 7.

Moreover, the recess of the main housing 4 is filled with a reflective encapsulation compound 6 which covers the side flanks of the semiconductor body 10 and of the first lamina 21 and fills the interspace between the second partial region 1012 of the outer surface 101 of the semiconductor body 10 and the second lamina 22. In this case, that surface of the reflective filling composition 6 facing away from the bottom area of the recess of the main housing 4 terminates flush with the underside of the second lamina 22 facing the semiconductor body 10. The second lamina 22 is thus arranged above the reflective encapsulation compound 6, in particular in an interspace between the reflective encapsulation compound and the optical element 7.

Figure 11A:
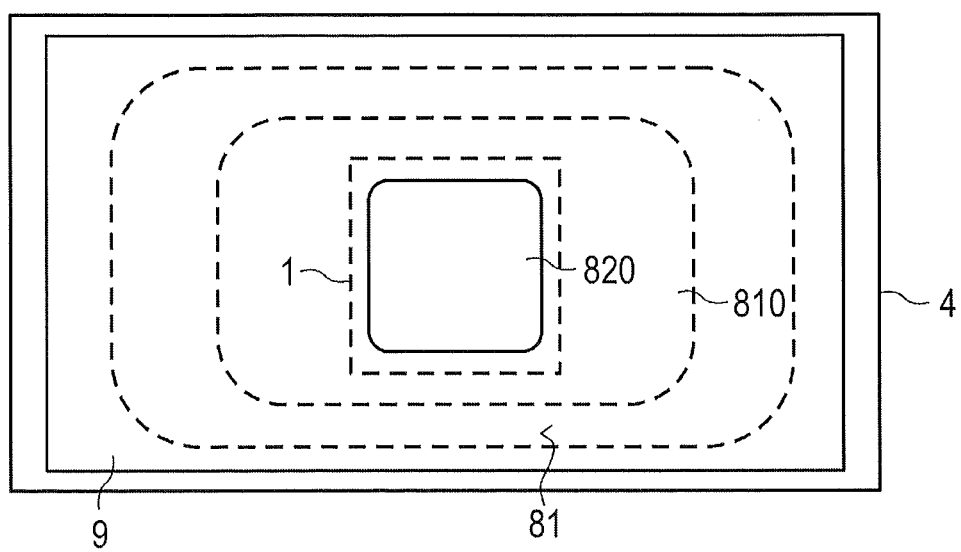
FIG. 11A shows a schematic plan view of an optoelectronic component in accordance with a seventh example.
Figure 11B:
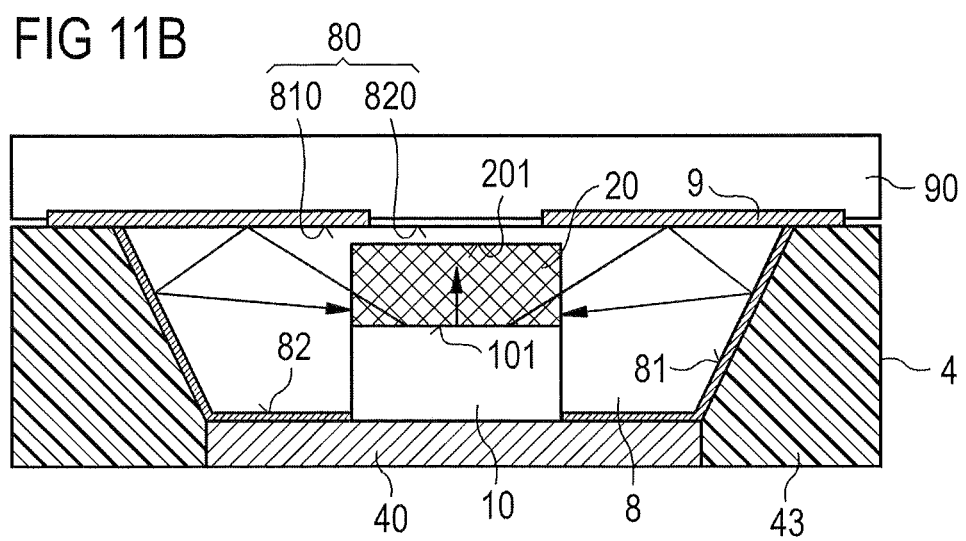
FIG. 11B shows a schematic section illustration of the component from FIG. 11A.

FIGS. 11A and 11B show an optoelectronic component in accordance with a seventh example in a schematic plan view and in a schematic sectional illustration, respectively. The component has a reflector cavity 8. In this component, the reflector cavity is formed by the circumferential side area 81 and the bottom area 82 of a recess of a main housing 4.

In this case, the side area 81 is a side area extending circumferentially around the bottom area 82 in a ring-shaped manner. In one variant of the component, the circumferential side area 81 is formed from a plurality of segments, for example, by the lateral surfaces of the truncated pyramid in the case of a reflector cavity 8 shaped as a truncated pyramid.

The main housing 4 is formed, for example, by a leadframe 40 being encapsulated with a housing main body 43 by injection molding. The leadframe 40 and/or the housing main body 42 can be reflective or, as shown in FIG. 11B, be provided with a reflective coating, for example, a metal layer, in particular a silver layer.

A semiconductor chip 1 is arranged in the reflector cavity 8. In this case, the semiconductor chip is fixed on the bottom area 82.

The semiconductor chip 1 has a semiconductor body 10 having a semiconductor layer sequence 11 containing a pn junction, a double heterostructure or a quantum well structure for generating light. Moreover, the semiconductor body 10 has a luminescence conversion element 20, which is fixed on an outer surface 101 of the semiconductor body 10 provided to emit primary light and facing away from the bottom area 82.

The semiconductor body 10 emits primary light by the semiconductor layer sequence 11. The luminescence conversion element 20 emits secondary light by wavelength conversion of at least part of the primary light emitted by the semiconductor body 10.

The luminescence conversion element 20 is, for example, a lamina provided with a phosphor and applied on the semiconductor body 10 before or after mounting in the main housing 4. The luminescence conversion element 20 may be spaced apart from the side area 81. The side flanks of the semiconductor body 10 need not be covered by the luminescence conversion element 20.

An opening 80 of the reflector cavity 8 is covered with a reflector layer 9. The reflector layer may be reflective both to the primary light and the secondary light. By way of example, the reflector layer comprises at least one metal such as aluminum and/or silver or consists of at least one metal.

The reflector layer 9 is applied to a carrier 90, for example. The carrier 90 may be transparent or translucent, in particular diffusely scattering. Alternatively, it can contain a dye.

The reflector layer 9 covers a first partial region 810 of the opening 80, while a second partial region 820 of the opening 80 is not covered by the reflector layer 9. The second partial region 82 is expediently provided to emit light. In this case, the second partial region 820 is a central region of the opening 80, and the first partial region 810 is an edge region of the opening 80 extending circumferentially around the central region 820.

In this component, in a plan view of the reflector layer 9, the second partial region completely overlaps the semiconductor chip 1 and in particular the luminescence conversion element 20. Preferably, a circumferential edge region of the semiconductor chip 1 and in particular of the luminescence conversion element 20 is covered by the first partial region 810 in a plan view of the reflector layer 9.

The luminescence conversion element 20 is designed, for example, such that less than 1% of the radiation intensity of the primary radiation emitted perpendicularly to the outer surface 101 and coupled into the luminescence conversion element 20 leaves the luminescence conversion element 20 at its coupling-out surface 201 facing away from the outer surface 101.

A smaller proportion of primary radiation which is coupled, for example, obliquely into the edge region of the luminescence conversion element 20 is absorbed therein such that part of the primary radiation emerges again, for example, from the side flanks of the luminescence conversion element 20 (see FIG. 11B). Alternatively or additionally, the semiconductor body can emit primary radiation from its side flanks.

The reflector layer 9 advantageously reduces the risk of unconverted primary radiation being coupled out from the component through the opening 80. In addition, the reflector layer 9 reflects at least part of the primary radiation to the luminescence conversion element 20 such that it can be wavelength-converted there to secondary radiation. In this way, the conversion efficiency of the component is advantageously particularly high.

Figure 12A:
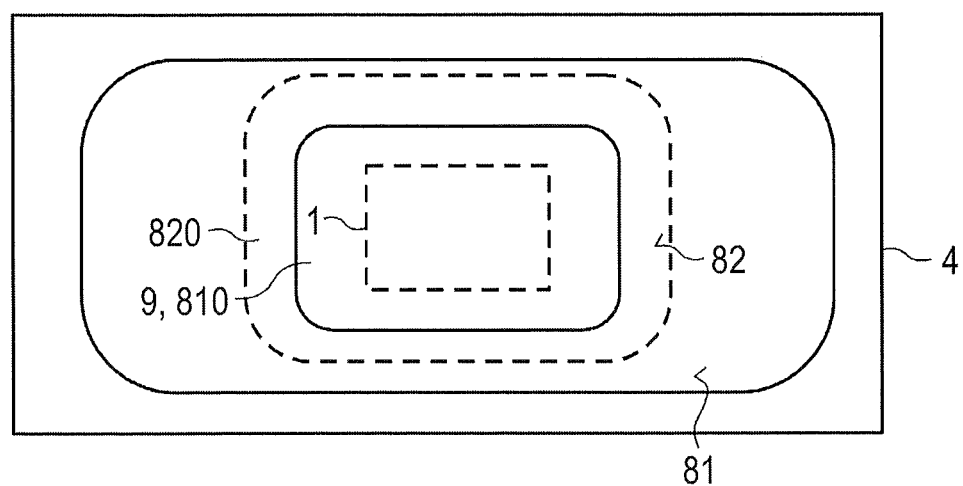
FIG. 12A shows a schematic plan view of an optoelectronic component in accordance with an eighth example.
Figure 12B:
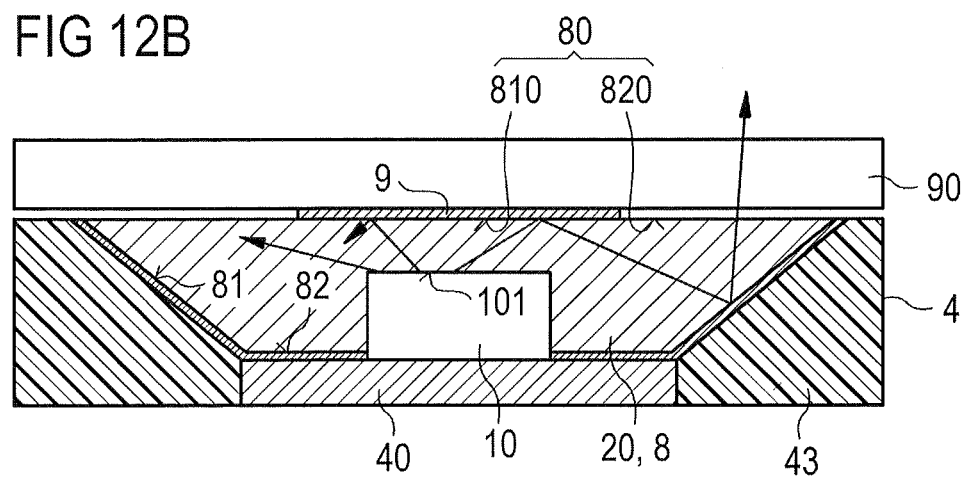
FIG. 12B shows a schematic sectional illustration of the optoelectronic component from FIG. 12A.

FIGS. 12A and 12B show an optoelectronic component in accordance with an eighth example in a schematic plan view and in a schematic sectional illustration, respectively.

The component differs from the component in accordance with the seventh example in that the first partial region 810 covered by the reflector layer 9 is a central region of the opening 80 of the reflector cavity 8 and an edge region 820 of the opening 80 that extends circumferentially around the central region 810 forms the second partial region 820 not covered by the reflector layer 9. In a plan view of the opening 80, the central region 810 projects laterally beyond the semiconductor chip 1 on all sides.

In contrast to the previous configuration, the luminescence conversion element 20 is not a layer that is part of the semiconductor chip 1. Moreover, the luminescence conversion element 20 is an encapsulation compound with which the reflector cavity 8 is filled and which encapsulates the semiconductor body 10. In particular, the reflector cavity 8 is completely filled with the luminescence conversion element 20.

The height of the encapsulation compound 20 above the semiconductor body 10 and the phosphor concentration C in the encapsulation compound are chosen in this case such that a proportion of at least ten percent, in particular of at least twenty percent, of the radiation intensity of the primary radiation emitted perpendicularly from the outer surface 101 of the semiconductor body 10 impinges on the reflector layer 9 at that side of the luminescence encapsulation 20 facing away from the semiconductor body 10.

Moreover, the luminescence conversion element is shaped such that a smaller proportion of primary radiation emitted at a greater angle from the outer surface 101 such that its optical path (without taking account of scattering and absorption processes in the luminescence conversion element 20) passes through the second partial region 820, impinges on the opening 80. By way of example, the proportion is less than or equal to five percent of the radiation power emitted at the respective angle, preferably less than or equal to two percent, for example, less than or equal to one percent.

In this way, the risk of the component emitting light inhomogeneously in terms of color from the opening 80 of the reflector cavity 8 is particularly low by the reflector layer. At the same time, a particularly flat component can advantageously be obtained.

Figure 13:
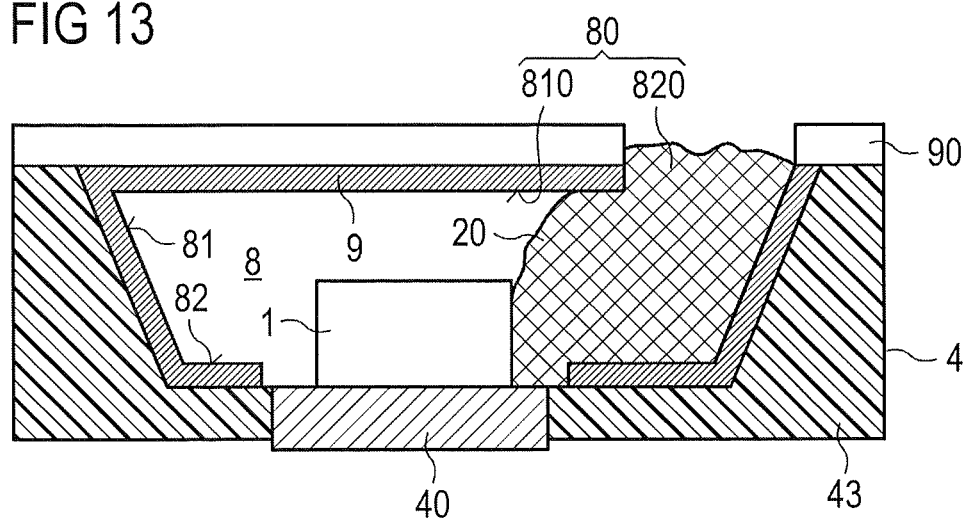
FIG. 13 shows a schematic sectional illustration of an optoelectronic component in accordance with a ninth example.

FIG. 13 shows a schematic cross section through an optoelectronic component in accordance with a ninth example.

This component differs from the previous component in that the second partial region 820 not covered by the reflector layer 9 is not extending circumferentially completely around the semiconductor chip 1. Instead, the second partial region 820 in this case constitutes a cutout of the reflector layer 9 that is offset laterally relative to the semiconductor chip 1. By way of example, the cutout is formed by a hole through the reflector layer 9 and the carrier 90.

The encapsulation compound forming the luminescence conversion element 20 is filled into the reflector cavity 8, for example, through the hole. In this case, it only partly fills the reflector cavity 8. In this case, the encapsulation compound 20 and the cutout 820 completely overlap in a plan view of the opening 80.

Figure 14:
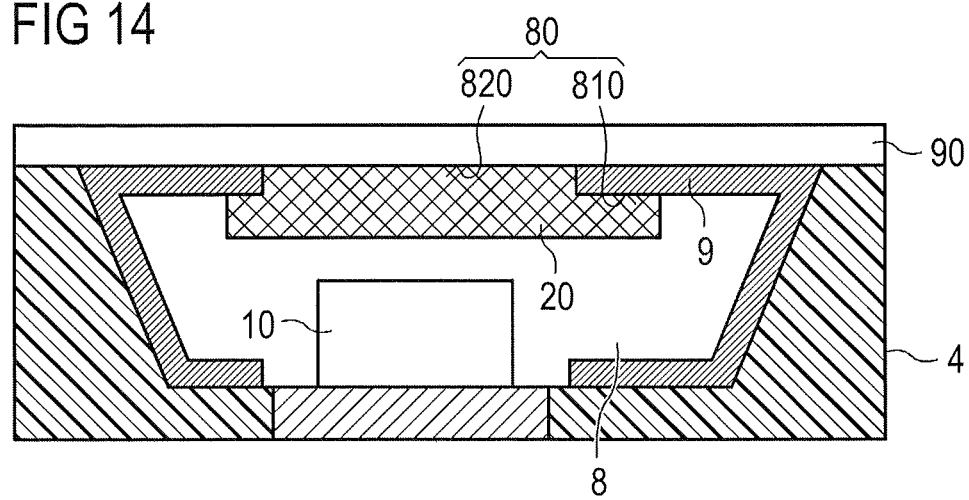
FIG. 14 shows a schematic sectional illustration of an optoelectronic component in accordance with a tenth example.

FIG. 14 shows a schematic cross section through an optoelectronic component in accordance with a tenth example.

This component differs from the component in accordance with the seventh example (see FIGS. 11A and 11B) in that the luminescence conversion layer 20 is not applied as a lamina to the semiconductor body 10. Instead it is applied to the carrier 90 such that it covers the partial region 820 left free by the reflector layer 9.

Our chips, components and methods are not restricted to the examples by the description on the basis of those examples. By way of example, any of the various semiconductor chips is suitable for any of the components and the methods are suitable to produce any of the components.

Furthermore, this disclosure encompasses any novel feature and also any combination of features in the examples and appended claims, even if the combination is not explicitly specified.

The invention claimed is:

1. An optoelectronic component comprising a reflector cavity, a light-emitting semiconductor body that emits primary light in the reflector cavity and a luminescence conversion element that emits secondary light by wavelength conversion of at least part of the primary light, wherein
    the reflector cavity has an opening,
    a first partial region of the opening is covered with a reflector layer,
    a second partial region of the opening is not covered with the reflector layer, and
    the luminescence conversion element in a plan view of the opening completely overlaps the second partial region, wherein, in a plan view of the opening, the second partial region laterally with respect to the semiconductor body is arranged in an edge region of the opening and wherein the luminescence conversion element is an encapsulation compound with which the reflector cavity is filled.

2. The optoelectronic component according to claim 1, wherein, in a plan view of the opening, the second partial region completely overlaps the semiconductor body.

3. The optoelectronic component according to claim 1, wherein the luminescence conversion element encapsulates the semiconductor body.

4. The optoelectronic component according to claim 1, wherein the reflector cavity is completely filled with the luminescence conversion element.

5. An optoelectronic component comprising:
    a reflector cavity,
    a light-emitting semiconductor body that emits primary light in the reflector cavity,
    a transparent or translucent carrier, and
    a luminescence conversion element that emits secondary light by wavelength conversion of at least part of the primary light,
    wherein
    the reflector cavity has an opening,
    a first partial region of the opening is covered with a reflector layer, said reflector layer being applied to the transparent or translucent carrier,
    a second partial region of the opening is not covered with the reflector layer,
    the luminescence conversion element in a plan view of the opening completely overlaps the second partial region,
    in a plan view of the opening, the second partial region laterally with respect to the semiconductor body is arranged in an edge region of the opening,
    the luminescence conversion element is an encapsulation compound with which the reflector cavity is filled, and
    the opening of the reflector cavity is completely covered by the transparent or translucent carrier.

6. The optoelectronic component according to claim 5, wherein the transparent or translucent carrier is a glass carrier or a plastic carrier.

7. The optoelectronic component according to claim 5, wherein the reflector layer contains gold so that the reflector layer is configured to absorb blue primary light and reflect yellow secondary light.

* * * * *